(12) United States Patent
Fujiyoshi et al.

(10) Patent No.: US 9,293,506 B2
(45) Date of Patent: Mar. 22, 2016

(54) DETECTION APPARATUS, DETECTION SYSTEM, AND METHOD FOR MANUFACTURING DETECTION APPARATUS

(71) Applicant: CANON KABUSHIKI KAISHA, Tokyo (JP)

(72) Inventors: Kentaro Fujiyoshi, Tokyo (JP); Chiori Mochizuki, Sagamihara (JP); Minoru Watanabe, Honjo (JP); Keigo Yokoyama, Honjo (JP); Masato Ofuji, Honjo (JP); Jun Kawanabe, Kodama-gun (JP); Hiroshi Wayama, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 107 days.

(21) Appl. No.: 13/958,270

(22) Filed: Aug. 2, 2013

(65) Prior Publication Data

US 2014/0035006 A1 Feb. 6, 2014

(30) Foreign Application Priority Data

Aug. 6, 2012 (JP) .................. 2012-173961

(51) Int. Cl.
*H01L 27/148* (2006.01)
*H01L 27/146* (2006.01)

(52) U.S. Cl.
CPC .... *H01L 27/14692* (2013.01); *H01L 27/14663* (2013.01); *H01L 27/14812* (2013.01)

(58) Field of Classification Search
CPC ............. H01L 29/7869; H01L 29/66969; H01L 27/1225; H01L 21/02565; H01L 21/02554; H01L 27/1255; H01L 27/14612; G09G 3/3233; G09G 2300/0861; G09G 2300/0842; G09G 3/3225; G09G 3/3648; G09G 2300/08

USPC ........ 257/43, 292, 72, 229, 40, 225, 428, 66, 257/71, 89; 438/104, 60, 687, 778; 348/308, 294, 296, 297, 300, 301, 367; 250/208.1, 370.09, 214.1, 366, 369, 250/393, 394

See application file for complete search history.

(56) References Cited

U.S. PATENT DOCUMENTS

| | | | |
|---|---|---|---|
| 5,619,033 | A | 4/1997 | Weisfield |
| 2004/0159794 | A1 | 8/2004 | Morii et al. |
| 2010/0001198 | A1 | 1/2010 | Yagi et al. |
| 2012/0126095 | A1* | 5/2012 | Watanabe et al. .......... 250/208.1 |

FOREIGN PATENT DOCUMENTS

| | | |
|---|---|---|
| CN | 1501758 A | 6/2004 |
| CN | 101013711 A | 8/2007 |
| CN | 101278553 A | 10/2008 |

* cited by examiner

*Primary Examiner* — Robert Bachner
(74) *Attorney, Agent, or Firm* — Canon USA Inc. IP Division

(57) ABSTRACT

A detection apparatus includes a plurality of pixels and a plurality of signal wires arranged on a substrate, in which each of the plurality of pixels includes a switch element arranged on the substrate and a conversion element arranged on the switch element, the conversion element includes a first electrode which is arranged on the switch element and electrically connected to the switch element and a semiconductor layer arranged over a plurality of the first electrodes, and a plurality of the switch elements is electrically connected to the plurality of signal wires, and the detection apparatus further includes a constant potential wire which is supplied with a constant potential, in which the first electrode is electrically connected to the constant potential wire in a part of pixels among the plurality of pixels.

10 Claims, 18 Drawing Sheets

DETECTION APPARATUS, DETECTION SYSTEM, AND METHOD FOR MANUFACTURING DETECTION APPARATUS

BACKGROUND OF THE INVENTION

1. Field of the Invention

The present invention relates to a method for manufacturing a detection apparatus applied to a medical image diagnostic apparatus, a nondestructive inspection apparatus, and an analyzer using radiation, the detection apparatus, and a detection system.

2. Description of the Related Art

In recent years, a thin film semiconductor manufacturing technique has been used for a detection apparatus and a radiation detection apparatus in which a switch element such as a thin film transistor (TFT) is combined with a conversion element such as a photoelectric conversion element. A pixel with a layered structure in which a conversion element is arranged over a switch element as discussed in U.S. Pat. No. 5,619,033 has been discussed to improve the sensitivity of a detection apparatus by improving the aperture ratio of the conversion element. The U.S. Pat. No. 5,619,033 further discusses a pixel with a layered structure in which the electrode (referred to as an individual electrode) of a conversion element electrically connected to a switch element is divided for each pixel and a semiconductor layer of the conversion element is arranged without separation over a plurality of pixels.

In the production process of the detection apparatus using the thin film semiconductor manufacturing technique, a defective pixel which has a defect in its conversion element and TFT can be produced at a certain probability due to contamination of foreign substances or a problem in a process. Then, US Patent Application Laid-Open No. 2004/0159794 discusses a repair technique in which a connection between the drain electrode or the source electrode of a TFT and a signal wire is cut off to electrically separate the defective pixel from the signal wire. US Patent Application Laid-Open No. 2004/0159794 discusses particularly a laser repair technique in which a connection between the drain electrode or the source electrode of a TFT and a signal wire is cut off by a laser.

However, if a detection apparatus with a conversion element of which semiconductor layer is not separated for each pixel is repaired, since a normal pixel adjacent to a defective pixel is connected to the defective pixel in the semiconductor layer, failure can be generated in the normal pixel due to the movement of carriers.

SUMMARY OF THE INVENTION

The present invention provides a detection apparatus and a method for manufacturing the same which are capable of preventing failure from occurring in the normal pixel even if a detection apparatus with a conversion element of which semiconductor layer is not separated for each pixel is repaired.

A detection apparatus includes a plurality of pixels and a plurality of signal wires arranged on a substrate, in which each of the plurality of pixels includes a switch element arranged on the substrate and a conversion element arranged on the switch element, wherein the conversion element includes a first electrode arranged on the switch element and electrically connected to the switch element and a semiconductor layer arranged over a plurality of the first electrodes, and wherein a plurality of the switch elements is electrically connected to the plurality of signal wires, and the detection apparatus further includes a constant potential wire supplied with a constant potential, in which the first electrode is electrically connected to the constant potential wire in apart of pixels among the plurality of pixels.

A method for manufacturing a detection apparatus includes performing a first step of forming on a substrate a plurality of signal wires, a plurality of switch elements electrically connected to the plurality of signal wires, and a constant potential wire supplied with constant potential, performing a second step of forming a plurality of conversion elements including a plurality of first electrodes which is electrically connected to the plurality of switch elements and formed on the plurality of switch elements and a semiconductor layer formed over the plurality of the first electrodes, and forming a plurality of pixels each including one switch element among the plurality of switch elements and one conversion element among the plurality of conversion elements, and performing a third step of electrically connecting a first electrode of the conversion element of a part of pixels among the plurality of pixels to the constant potential wire.

Further features and aspects of the present invention will become apparent from the following description of exemplary embodiments with reference to the attached drawings.

DESCRIPTION OF THE EMBODIMENTS

An exemplary embodiment of the present invention is described in detail below with reference to the accompanying drawings.

A first exemplary embodiment is described below.

Figure 1A:
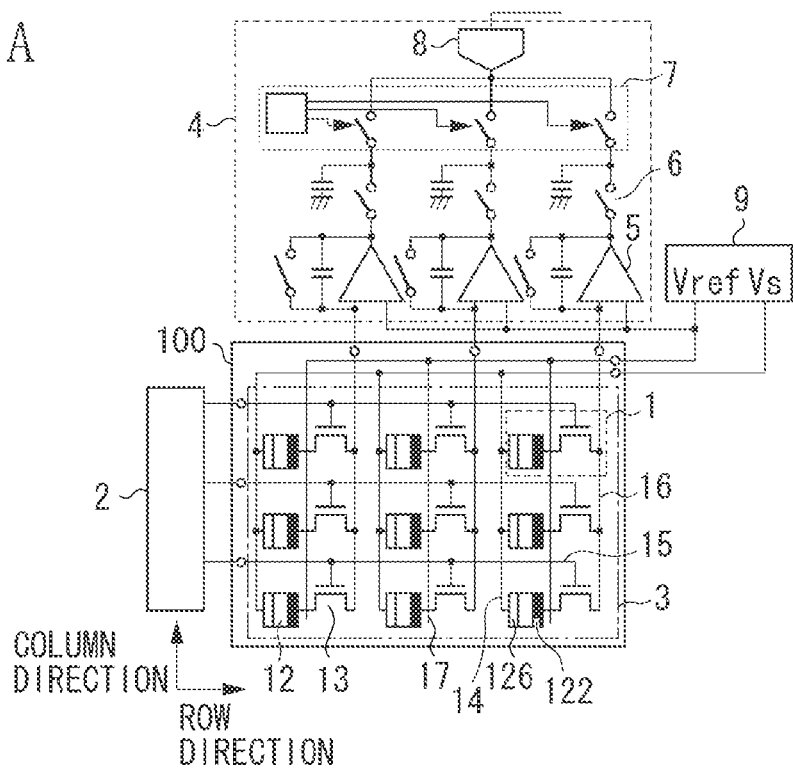
FIG. 1A is a schematic equivalent circuit diagram of a detection apparatus according to a first exemplary embodiment.
Figure 1B:
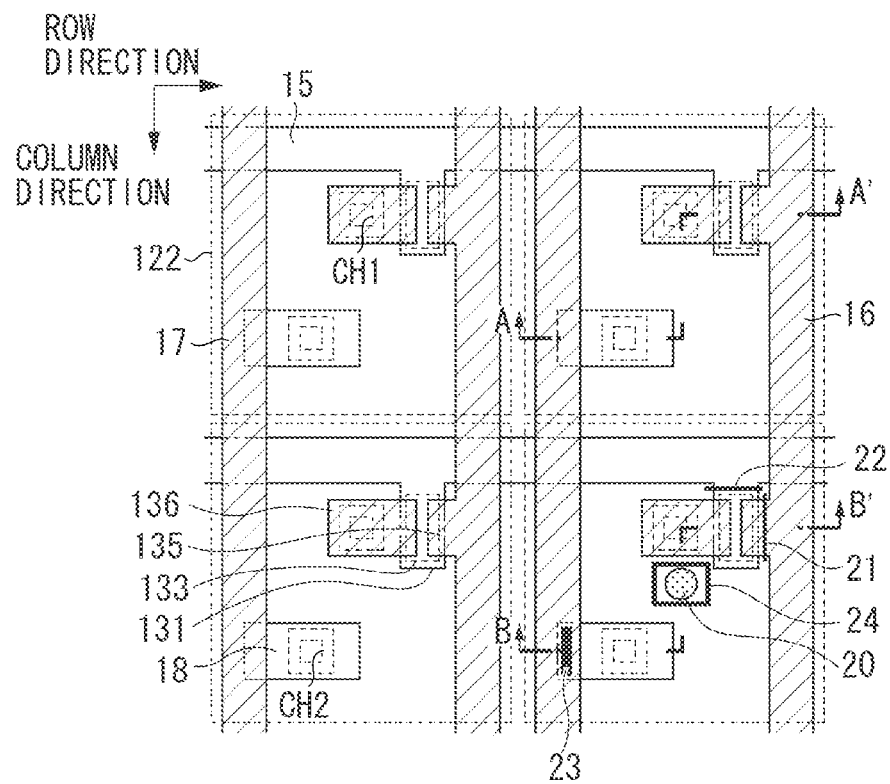
FIG. 1B is a schematic top view of a pixel in the detection apparatus according to the first exemplary embodiment.
Figure 2A:
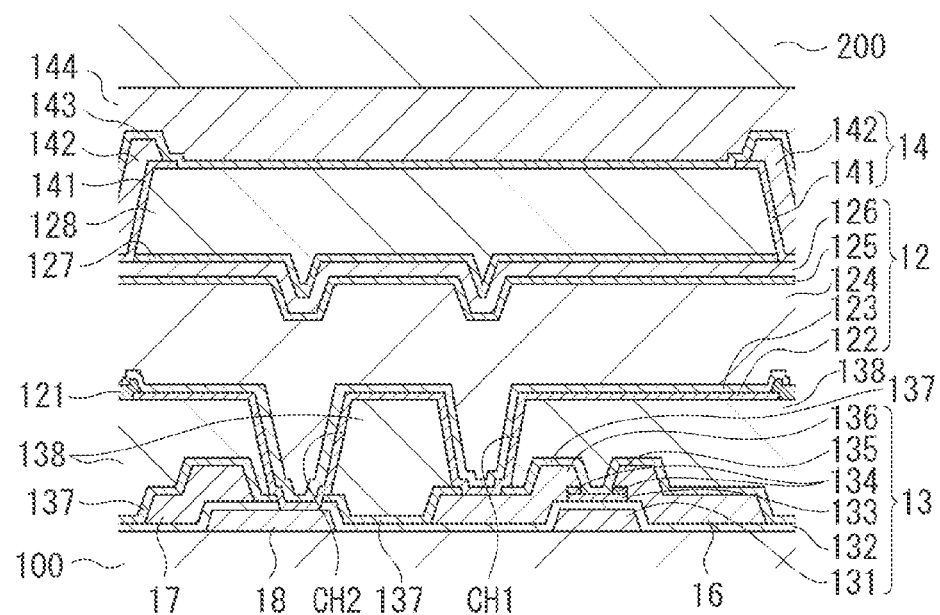
FIGS. 2A and 2B are schematic cross sections of one pixel in the detection apparatus according to the first exemplary embodiment.
Figure 2B:
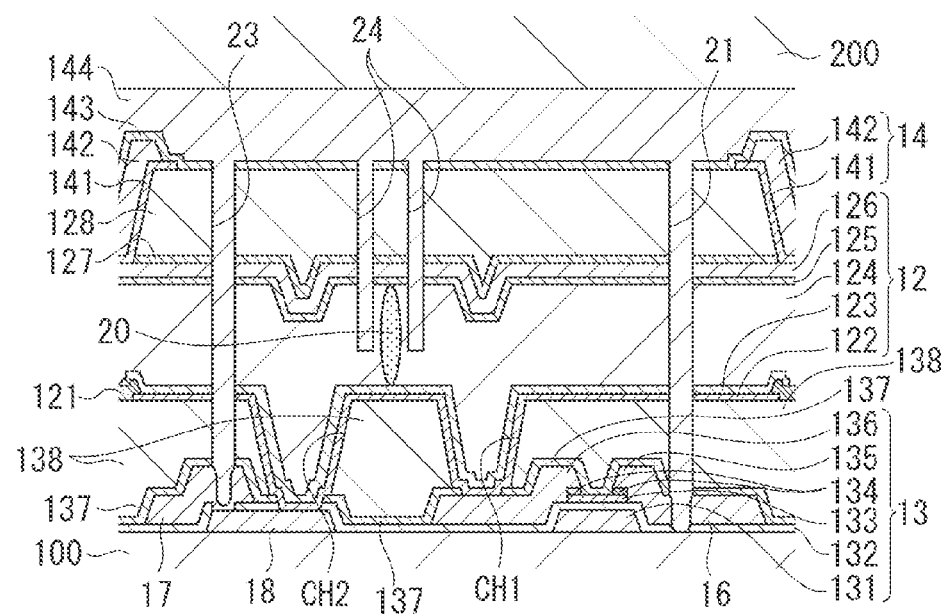

A detection apparatus according to the first exemplary embodiment of the present invention is described with reference to FIGS. 1A and 1B and FIGS. 2A and 2B. FIG. 1A is a schematic equivalent circuit diagram of the detection apparatus according to the first exemplary embodiment. In FIG. 1A, for the sake of simplification, the equivalent circuit diagram with a three-row and three-column is used, however, the present invention is not limited to the circuit diagram. The detection apparatus has a conversion unit 3 which is a pixel array with n-row and m-column (n and m are respectively a natural number of two or more). FIG. 1B is a schematic top view of one pixel and illustrates only a first electrode 122 of the conversion element with each insulation layer and the semiconductor layers of the conversion element omitted for the sake of simplification. FIG. 2A is a schematic cross section along line A-A' of a normal pixel in FIG. 1B. FIG. 2B is a schematic cross section along line B-B' of a defective pixel in FIG. 1B. FIGS. 2A and 2B illustrate also each insulation layer and the semiconductor layers of the conversion element omitted in FIG. 1B.

In the detection apparatus according to the present exemplary embodiment, a conversion unit 3 including a plurality of pixels 1 which are arranged in the row and column directions is provided on the surface of a substrate 100. Each pixel 1 includes a conversion element 12 which converts radiation or light into a charge and a thin film transistor (TFT) 13 which is a switch element outputting an electric signal according to the charge of the conversion element 12. A scintillator (not illustrated) converting radiation into visible light may be arranged on the surface of a second electrode 126 of the conversion element. An electrode wire 14 is electrically connected in common to the second electrode 126 of a plurality of the conversion elements 12 arranged in the column direction.

The electrode wire 14 is illustrated for the sake of convenience, however, the present invention is not limited to a configuration using a wire structure. An electrical connection may be made only by the second electrode 126 arranged over the entire surface of the pixel array without using the wire structure. A second main electrode 136 of a TFT described below is electrically connected to a first electrode 122 of the conversion element 12. A control wire 15 is electrically connected in common to a control electrode 131 of a plurality of the TFTs 13 arranged in the row direction and electrically connected to a driving circuit 2. The driving circuits 2 sequentially or simultaneously supplies a drive pulse to the plurality of control wire 15 arranged side by side in the column direction, so that electric signals from the pixels in units of rows are output in parallel to a plurality of signal wires 16 arranged side by side in the row direction.

The signal wires 16 are electrically connected in common to a first main electrode 135 of a plurality of the TFTs 13 arranged in the column direction and electrically connected to a reading circuit 4. The reading circuit 4 includes an integration amplifier 5 which integrates and amplifies an electrical signal from the signal wire 16 for each signal wire 16 and a sample and hold circuit 6 which samples and holds the electrical signal amplified and output by the integration amplifier 5. The reading circuit 4 further includes a multiplexer 7 which converts electric signals output in parallel from a plurality of sample and hold circuits 6 into series electric signals and an analog-to-digital (A/D) converter 8 which converts the output electric signal into digital data. The non-inverting input terminal of the integration amplifier 5 is supplied with a reference potential Vref from a power source circuit 9.

The power source circuit 9 is connected to a plurality of the electrode wires 14 arranged in the row direction to supply the second electrode 126 of the conversion element 12 with a bias potential Vs. Constant potential wires 17 supplied with a predetermined constant potential are arranged in the column direction. The constant potential wire 17 is arranged in parallel with the signal wire 16. If the defective pixel is generated to apply an unintended potential to the first electrode 122 of the conversion element, the first electrode 122 is electrically connected to the constant potential wire 17 to allow the first electrode 122 to be fixed to the constant potential supplied to the constant potential wire 17. The control electrode of the TFT 13 is a gate electrode, the first main electrode 135 is one of the source and drain electrodes, and the second main electrode 136 is the other of the source and drain electrodes.

A configuration of a normal pixel is described below with reference to FIG. 1B and FIG. 2A. One pixel 11 of the detection apparatus according to the present exemplary embodiment includes the conversion element 12 which converts radiation or light into a charge and the TFT 13 which is a switch element outputting an electric signal according to the charge of the conversion element 12. The conversion element 12 uses a positive intrinsic negative (PIN) photodiode. The conversion element 12 is arranged to be laminated over the TFT 13 provided on an insulative substrate 100 such as a glass substrate with an interlayer insulating layer 138 sandwiched between the conversion element 12 and the TFT 13.

The TFT 13 is structured such that a control electrode 131, an insulation layer 132, a semiconductor layer 133, an impurity semiconductor layer 134 higher in impurity density than the semiconductor layer 133, the first main electrode 135, and the second main electrode 136 are stacked one on top of another in this order on the substrate 100. A partial area of the impurity semiconductor layer 134 is in contact with the first main electrode 135 and the second main electrode 136 and an area between areas of the semiconductor layer 133 which is in contact with the partial area is a TFT channel. The control electrode 131 is electrically connected to the control wire 15, the first main electrode 135 is electrically connected to a signal wire 16, and the second main electrode 136 is electrically connected to the first electrode 122 of the conversion element 12. A constant potential wire 17 and a connection member 18 are arranged over and on the substrate 100 respectively.

In the present exemplary embodiment, as described below, the control electrode 131, the control wire 15, and the connection member 18 are formed of the same conductive film and the control electrode 131 forms a part of the control wire 15. In the present exemplary embodiment, as described below, the first main electrode 135, the second main electrode 136, the signal wire 16, and the constant potential wire 17 are formed of the same conductive film and the first main electrode 135 forms a part of the signal wire 16.

As illustrated in FIG. 2A, the connection member 18 and the constant potential wire 17 are arranged to be at least partly superimposed on each other via the insulation layer 132. In the present exemplary embodiment, an inverse stagger TFT using the semiconductor layer 133 with amorphous silicon as a main material and the impurity semiconductor layer 134 is used as a switch element, however, the present invention is not limited to the inverse stagger TFT. For example, a stagger TFT using polycrystalline silicon as a main material may be used or an organic TFT or an oxide TFT may be used.

A protective layer 137 is arranged to cover the TFT 13, the control wire 15, the signal wire 16, and the constant potential wire 17. The interlayer insulating layer 138 is arranged between the substrate 100 and a plurality of the first electrodes 122 to cover a plurality of the TFTs 13. The protective layer 137 and the interlayer insulating layer 138 include a contact hole.

The conversion element 12 is structured such that the first electrode 122, a first conductivity type impurity semiconductor layer 123, a semiconductor layer 124, a second conductivity type impurity semiconductor layer 125, and a second electrode 126 are stacked one on top of another in this order on the interlayer insulating layer 138. It is desirable that the semiconductor layer 124 arranged between the first electrode 122 and the second electrode 126 is an intrinsic semiconductor. The first conductivity type impurity semiconductor layer 123 arranged between the first electrode 122 and the semiconductor layer 124 indicates a first conductivity type polarity and is higher in a first conductivity type impurity density than the semiconductor layer 124 and the second conductivity type impurity semiconductor layer 125. The second conductivity impurity semiconductor layer 125 arranged between the semiconductor layer 124 and the second electrode 126 indicates a second conductivity type polarity opposite to the first conductivity type polarity and is higher in a second conductivity type impurity density than the first conductivity type impurity semiconductor layer 123 and the semiconductor layer 124.

The first and second conductivity type impurity semiconductor layers have a conductivity type different from each other in polarity. For example, the first conductivity type layer is an n-type and the second conductivity layer is a p-type. The first electrode 122 of the conversion element 12 is electrically connected to the second main electrode 136 at a first contact hall CH1 provided in the protective layer 137, and the interlayer insulating layer 138 of the TFT 13. The first electrode 122 of the conversion element 12 is electrically connected to the connection member 18 at a second contact hall CH2 provided in the protective layer 137, and the interlayer insulating layer 138. The second electrode 126 is electrically connected to the electrode wire 14 described below.

In the present exemplary embodiment, a photo diode using the first conductive impurity semiconductor layer 123, the semiconductor layer 124, and the second conductive impurity semiconductor layer 125, with amorphous silicon as a main material is used, however, the present invention is not limited to the above. For example, an element may use the first conductive impurity semiconductor layer 123, the semiconductor layer 124, and the second conductive impurity semiconductor layer 125, with amorphous selenium as a main material to directly convert radiation into a charge.

A transparent conductive oxide such as a light transmitting indium-tin oxide (ITO) is used in the first electrode 122 and the second electrode 126 as the conversion element. A metallic material may be used in the first electrode 122. Particularly if the conversion element 12 is a indirect conversion element including a photoelectric conversion element and a wavelength conversion element, a transparent conductive oxide such as a light transmitting ITO is used in the second electrode 126 which is an electrode of the wavelength conversion element side. A conductive element made of aluminum low in light transmissivity may be used in the first electrode 122 farther from the wavelength conversion element than the second electrode 126.

An insulation member 121 made of an inorganic insulation material is arranged in contact with the interlayer insulating layer 138 between a plurality of the first electrodes 122 on the interlayer insulating layer 138. The first electrodes 122 and the insulation member 121 are arranged on the interlayer insulating layer 138 to cover the interlayer insulating layer 138. For this reason, the interlayer insulating layer 138 is not exposed in a surface in depositing an impurity semiconductor film being the impurity semiconductor layer 123 to allow reducing the contamination of an organic insulation material in the impurity semiconductor layer 123.

In the present exemplary embodiment, the impurity semiconductor layer 123 is separated for each pixel on the insulation member 121. At the time of a dry etching process for the separation, the insulation member 121 acts as an etching stopper layer to preclude the interlayer insulating layer 138 from being exposed to the species of the dry etching, enabling preventing the organic insulation material from contaminating each layer.

A passivation layer 127 and an interlayer insulating layer 128 are provided to cover the conversion element 12. The passivation layer 127 employs an inorganic insulation material such as silicon oxide or silicon nitride and is provided to cover the conversion element 12 and the insulation layer 121. The interlayer insulating layer 128 is arranged between the second electrode 126 and the electrode wire 14 to cover the passivation layer 127. The passivation layer 127 and the interlayer insulating layer 128 have a contact hole. The second electrode 126 of the conversion element 12 is electrically connected to the electrode wire 14 at the contact hole provided in the passivation layer 127 and the interlayer insulating layer 128. The interlayer insulating layer 128 can employ an organic insulation material capable of thickly forming the layer to reduce a parasitic capacity between the conversion element 12 and the electrode wire 14.

The electrode wire 14 includes a first conductive layer 141 which is made of transparent conductive oxide and arranged on the interlayer insulating layer 128 and a second conductive layer 142 which is made of a metal material and arranged on the first conductive layer 141. The first conductive layer 141 is connected to the second electrode 126 of the conversion element 12 at the contact hole provided in the passivation layer 127 and the interlayer insulating layer 128. The second conductive layer 142 is arranged on the first conductive layer 141 so that the orthogonal projection of the second conductive layer 142 is positioned between the two first electrodes 122 of two adjacent conversion elements 12.

A passivation layer 143 of an inorganic insulation material such as silicon oxide or silicon nitride is provided to cover the electrode wire 14. A flattening layer 144 of an organic insulation material is arranged to cover the passivation layer 143.

A scintillator 200 that converts radiation into light which can be detected by a photoelectric conversion element is arranged on the flattening layer 144.

A configuration of a defective pixel is described below with reference to FIG. 1B and FIG. 2B. A defective pixel in which a foreign matter 20 contaminates the conversion element 12 is cited as an example. The defective pixel of the present invention is not limited to this, but a defective pixel resulting from a short-circuit between the electrodes or a characteristic abnormality of the TFT 13 can be cited as an example.

As illustrated in FIG. 1B and FIG. 2B, in the defective pixel, the first main electrode 135 has a disconnection area 21 to cut off the connection of the first main electrode 135 to the signal wire 16. The disconnection area 21 can inhibit an electric signal generated in the defective pixel from traveling to the reading circuit 4 via the signal wire 16. The disconnection area 21 electrically separates the first electrode 122 from the signal wire 16. As described below, the disconnection area 21 is an area where a part of the first main electrode 135 is irradiated with laser to be melted and transpired.

The control electrode 131 has a disconnection area 22 to cut off the connection of the control electrode 131 to the control wire 15. The disconnection area 22 is an area where a part of the control electrode 131 is irradiated with laser to be melted and transpired. The disconnection area 22 allows preventing the drive pulse supplied to the control wire 15 from being influenced by an electric signal generated in the defective pixel.

The defective pixel has a connection area 23 where the first electrode 122 is electrically connected to the constant potential wire 17. In the present exemplary embodiment, the connection area 23 is an area where an area where the constant potential wire 17 arranged so that a part thereof is superimposed on the connection member 18 via the insulation layer 132 is superimposed on the connection member 18 and the connection member 18 are melted by laser irradiation. Thereby, the first electrode 122 is electrically connected to the constant potential wire 17 by electrically connecting the connection member 18 to the constant potential wire 17 via the connection area 23. A material for the constant potential wire 17 and the connection member 18 is desirably metal with a low melting point such as Al. Since conductive material to be melted increases, the constant potential wire 17 is desirably thicker than the insulation layer 132. Irradiation with a laser beam can be made from the upper or the lower side of the substrate 100. FIG. 2B illustrates an example in which the laser irradiation is made from the upper side of the substrate 100.

The following describes a problem which can occur in a case where the first electrode 122 is not electrically connected to the constant potential wire 17. Normally, a voltage for converting radiation or light into a charge is applied across the first and second electrodes 122 and 126 of the conversion element. For that reason, the first electrode 122 is supplied with a predetermined potential via the signal wire 16 and the TFT 13 and the second electrode 126 is supplied with a potential different from the predetermined potential via the electrode wire 14. On the other hand, in the defective pixel, the first electrode 122 is electrically disconnected from the signal wire 16, so that the first electrode 122 is electrically in a floating state and the potential thereof gradually becomes equal to the potential supplied to the second electrode 126. This produces a large difference in potential gradient between the first electrode 122 of a normal pixel and the first electrode 122 of the defective pixel.

In such a state, if the potential of the first electrode 122 of the defective pixel is fluctuated by the driving pulse supplied to the control wire 15 to be an unwanted potential, a large amount of charges may flow into adjacent normal pixels according to the potential gradient via the semiconductor layer 124. This adds electric signals influenced by the charges flowing thereinto to the electric signals obtained from the normal pixels adjacent to the defective pixel, so that a normal electric signal may not be obtained.

In order to solve the above problem, the first electrode 122 is electrically connected to the constant potential wire 17 to fix the first electrode 122 to a predetermined constant potential. The constant potential needs to be supplied to the constant potential wire 17 so that a forward direction bias is not applied to a PIN type photo diode. For example, if the first conductivity type impurity semiconductor layer 123 is an n-type and the second conductivity type impurity semiconductor layer 125 is a p-type, the constant potential supplied to the constant potential wire 17 needs to be set to a potential equal to or greater than the bias potential Vs supplied to the second electrode 126.

An excessive bias in the reverse direction increases a difference in potential from the first electrode of an adjacent pixel and to bring the potential out of balance in a defective pixel portion. For this reason, the constant potential supplied to the constant potential wire is desirably fixed at most to a potential at which dark current being 10 times or less the dark current in the normal state flows. Furthermore, the constant potential is desirably fixed to a range of a variation in the potential of the first electrode 122 of the conversion element 12 of the normal pixel and desirably fixed to a range of a potential between a potential of the first electrode 122 at the time when the conversion element of the normal pixel is irradiated with radiation and a potential of the first electrode 122 at the time when the conversion element is not irradiated with radiation. The constant potential can be set to a reference potential Vref being a potential equal to the potential supplied to the first electrode 122 of the normal pixel.

If the first conductivity type impurity semiconductor layer 123 is a p-type and the second conductivity type impurity semiconductor layer 125 is an n-type, the above described magnitude relationship of the potentials is vice versa. For example, a fixed potential wire potential is set to equal to or lower than Vs potential not to apply a reverse direction bias to the photo diode. In the present exemplary embodiment, the PIN type photodiode is used, however, a similar effect can be achieved even by a metal-insulator-semiconductor (MIS) type photoelectric conversion element in which the first electrode, the insulation layer, the semiconductor layer, the impurity semiconductor layer, and the second electrode are stacked one on top of another in this order and a configuration in which the semiconductor layer is not separated for each pixel.

As illustrated in FIG. 2B, if the foreign matter 20 contaminates the conversion element 12 to cause a defect, a disconnection area 24 is desirably provided around the foreign matter 20. The first electrode 122 and the second electrode 126 are short-circuited by the foreign matter 20 and a short circuit due to the foreign matter 20 is unstable. It is desirable that the first electrode 122 is electrically connected to the constant potential wire 17 to stabilize the conversion element 12 with setting the area of the second electrode 126 being contact with the foreign matter 20 to be floating. As described below, the disconnection area 24 is an area where apart of the second electrode 126 is irradiated with laser to be melted and transpired.

A method for manufacturing the detection apparatus according to the first exemplary embodiment is described below with reference to FIGS. 3A to 3F and FIGS. 4A to 4C. FIGS. 3A to 3F and FIGS. 4A and 4B are schematic cross sections along A-A' of a normal pixel in FIG. 1B in the manufacturing process. FIG. 4C is a schematic cross section along B-B' of a defective pixel in FIG. 1B.

Figure 3A:
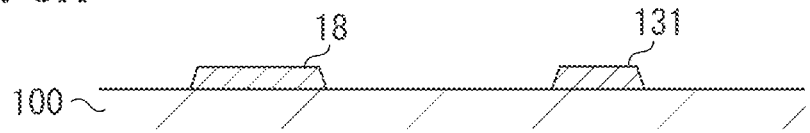
FIGS. 3A, 3B, 3C, 3D, 3E, and 3F are schematic cross sections illustrating a method for manufacturing the detection apparatus according to the first exemplary embodiment.

In the process illustrated in FIG. 3A, a conductive film of Al is deposited on the insulative substrate 100 by a sputtering method and wet-etched to form a control wire 15 (not illustrated), a control electrode 131, and a connection member 18.

Figure 3B:
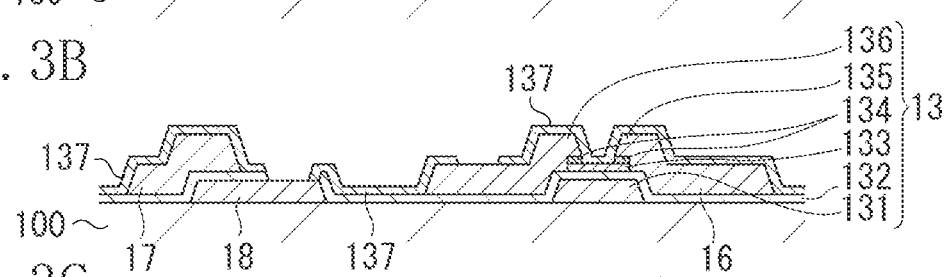

In the process illustrated in FIG. 3B, an insulation film of silicon nitride film is deposited by a plasma chemical vapor deposition (CVD) method to cover the control wire 15, the control electrode 131, and the connection member 18. A semiconductor film of amorphous silicon film and amorphous silicon film to which phosphorus is doped as an impurity as a first conductivity type impurity semiconductor film are deposited one on top of another by the plasma CVD method to form the semiconductor layer 133 and the impurity semiconductor layer 134 by dry etching. A conductive film of Al is deposited to cover the impurity semiconductor layer 134 by the sputtering method and wet-etched to form the signal wire 16, the first main electrode 135, the second main electrode 136, and the constant potential wire 17. An insulation film of silicon nitride film is deposited by the plasma CVD method to cover the signal wire 16, the first main electrode 135, the second main electrode 136, and the constant potential wire 17. The insulation film of a partial area on the connection member 18 and a partial area on the second main electrode 136 are removed by the dry etching to form the insulation layer 132 and the protection layer 137. The plurality of TFTs 13, the control wires 15, the signal wires 16, the constant potential wires 17, and the connection members 18 are formed on the substrate 100 in the processes illustrated in FIGS. 3A and 3B. In the present exemplary embodiment, the processes illustrated in FIGS. 3A and 3B correspond to a first process of the present invention.

Figure 3C:
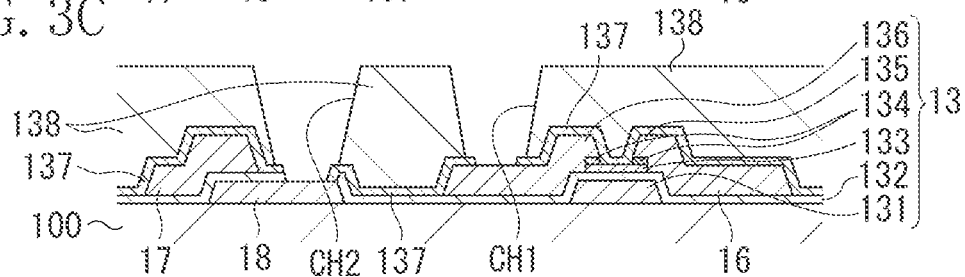

In the process illustrated in FIG. 3C, acrylic resin being a photosensitive organic material is coated to form a film as an interlayer insulating film using a coating device such as a spinner to cover the TFT 13, the connection member 18, and the protection layer 136. Polyimide resin can also be used as photosensitive organic material. The interlayer insulation film of a partial area on the connection member 18 and a partial area on the second main electrode 136 is removed using a desired mask and by exposure and development processes to form the interlayer insulating layer 138 having the first and second contact holes CH1 and CH2.

Figure 3D:
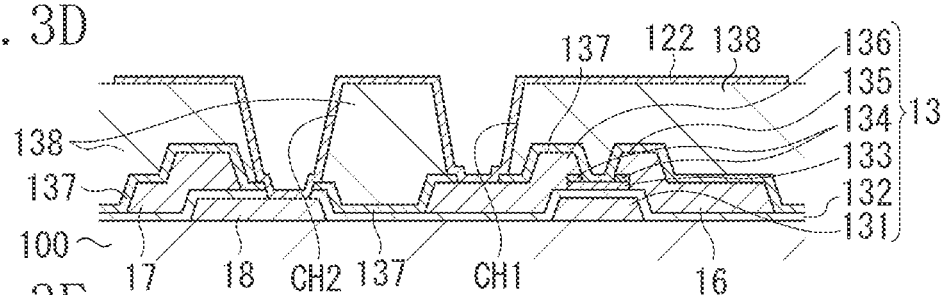

In the process illustrated in FIG. 3D, an amorphous transparent conductive oxide film of the ITO is deposited by the sputtering method to cover the TFT 13, the connection member 18, and the interlayer insulating layer 138. The transparent conductive oxide film is wet-etched using the desired mask and polycrystallized by an anneal process to form the first electrode 122. The ITO is used here as the transparent conductive oxide, however, ZnO, SnO2, ATO, AZO, CdIn2O4, MgIn2O4, ZnGa2O4, and InGaZnO4 may be advantageously used. In addition, the transparent conductive oxide such as delafossite oxide containing Cu such as CuAlO2, which can be in the amorphous state, can also be used. The first electrode 122 is electrically connected to a predetermined connection member 18 in the process, but not electrically connected to the constant potential wire 17. The predetermined connection member 18 refers to the connection member 18 corresponding to each of a plurality of the first electrodes 122.

Figure 3E:
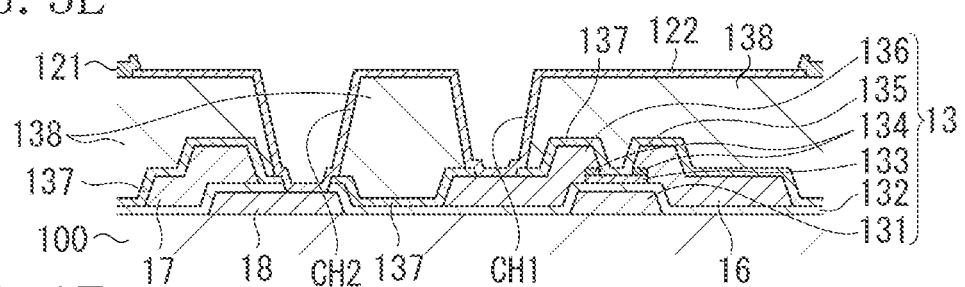

In the process illustrated in FIG. 3E, insulation film of general inorganic material such as silicon nitride or silicon oxide is deposited by the plasma CVD method to cover the interlayer insulating layer 138 and the first electrodes 122. The insulation film is etched using the desired mask to form the insulation member 121 for covering with the first electrodes 122 the surface of the interlayer insulating layer 138.

Figure 3F:
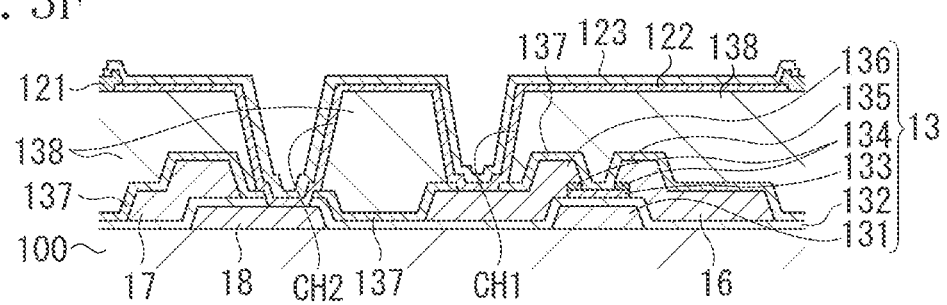

In the process illustrated in FIG. 3F, an amorphous silicon film to which phosphorus is doped as an impurity as the first conductivity type impurity semiconductor film is deposited by the plasma CVD method to cover the insulation member 121 and the first electrode 122. A part of the impurity semiconductor film on the insulation member 121 is removed by dry etching using the desired mask to form the first conductive impurity semiconductor layer 123 separated for each first electrode 122. The removal by dry etching is performed on the insulation member 121. For this reason, the insulation member 121 acts as an etching stopper layer to preclude the interlayer insulating layer 138 from being exposed to the species of the dry etching, enabling preventing the organic insulation material from contaminating the first conductive impurity semiconductor layer 123.

Figure 4A:
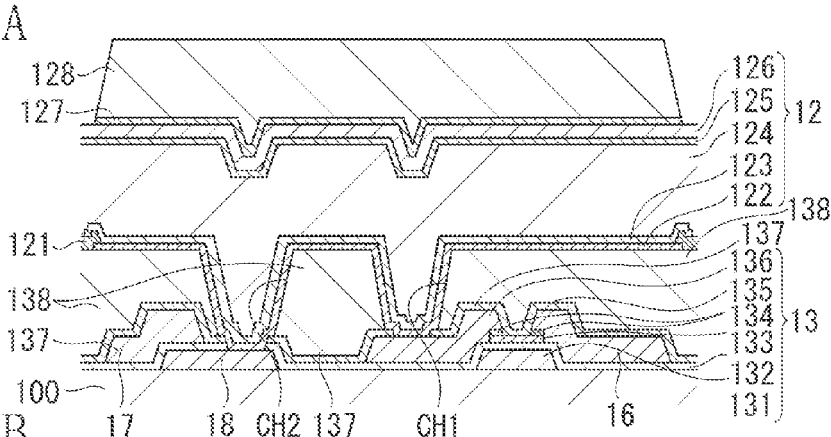
FIGS. 4A, 4B, and 4C are schematic cross sections illustrating a method for manufacturing the detection apparatus according to the first exemplary embodiment.

In the process illustrated in FIG. 4A, the semiconductor layer 124 of amorphous silicon film is deposited by the plasma CVD method to cover the insulation member 121 and the first conductive impurity semiconductor layer 123. The second conductivity type impurity semiconductor layer 125 of amorphous silicon film in which boron is mixed as an impurity is deposited by the plasma CVD method to cover the semiconductor layer 124. The conductive film of the transparent conductive oxide film is deposited by the sputtering method to cover the second conductive impurity semiconductor layer 125, forming the second electrode 126. The insulation film of inorganic insulation material such as silicon nitride film is deposited by the plasma CVD method to cover the second electrode 126. Acrylic resin being an photosensitive organic insulation material is coated to form a film as an interlayer insulating layer to cover the insulation film. The interlayer insulating layer 128 and the passivation layer 127 which have the contact hole are formed on the second electrode 126 using the desired mask. In the present exemplary embodiment, the processes illustrated in FIGS. 3C to 3F and FIG. 4A correspond to a second process of the present invention.

Figure 4B:
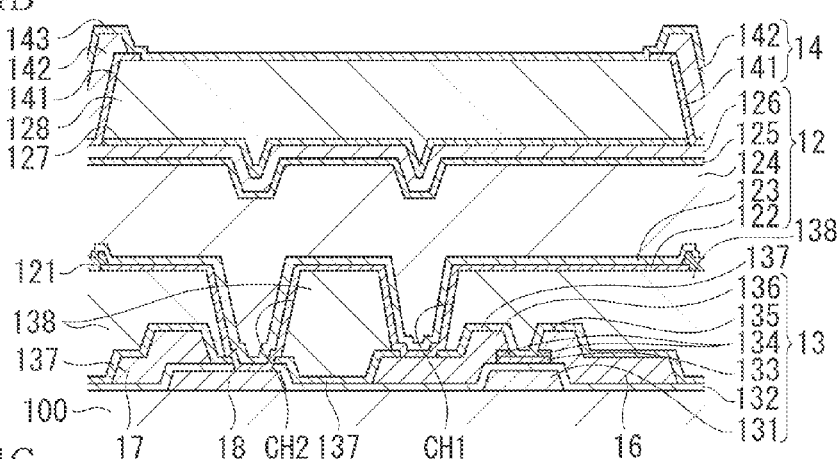
Figure 4C:
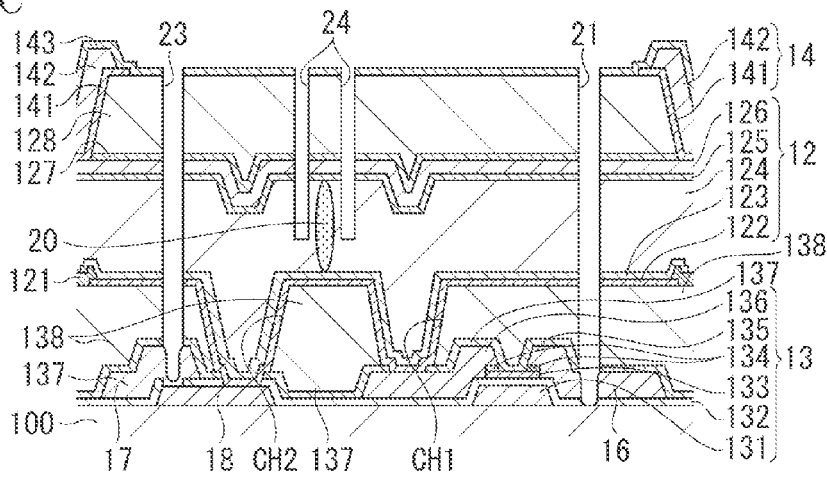

In the process illustrated in FIG. 4B, a transparent conductive oxide is deposited by the sputtering method to cover the interlayer insulating layer 128 and the second electrode 126. The transparent conductive oxide is wet-etched using the desired mask to form the first conductive layer 141. A metal film such as Al is deposited by the sputtering method to cover the first conductive layer 141 and the interlayer insulating layer 128. The metal film is wet-etched using the desired mask to form the second conductive layer 142 on a part of the first conductive layer 141. In this process, the second conductive layer 142 is electrically connected to the second electrode 126 of the conversion element 12 by the first conductive layer 141. At this point, the first conductive layer 141 is formed of the transparent conductive oxide to prevent numerical aperture from being lowered. This forms the electrode wire 14 which is formed of the first and second conductive layers 141 and 142. The passivation layer 143 is formed to cover the electrode wire 14 and the interlayer insulating layer 128.

In the process illustrated in FIG. 4C, a partial area of the control electrode 131 is irradiated with laser with a first strength (power) from the upper side of the substrate 100. This forms an opening in which the partial area of the control electrode 131 and the compositions thereover are melted and transpired to form the disconnection area 22. The strength (power) of laser is determined by the product of the energy of laser per unit area (energy density), the area irradiated with laser, and time for laser irradiation. The partial area of the control electrode 131 is irradiated with laser with a second strength smaller than the first strength from the upper side of the substrate 100 to form the opening in which the partial area of the control electrode 131 and the compositions thereover are melted and transpired, forming the disconnection area 21.

An area where the constant potential wire 17 arranged so that a part thereof is superimposed on the connection member 18 via the insulation layer 132 is superimposed on the connection member 18 is irradiated with laser with a third strength smaller than the first strength from the upper side of the substrate 100. This forms the opening in which the compositions over the constant potential wire 17 are transpired, transpiring the insulation layer 132 to weld the constant potential wire 17 and the connection member 18 together, which forms the connection area 23 to electrically connect the first electrode 122 to the constant potential wire 17.

A partial area around the foreign matter 20 in the second electrode 126 is irradiated with laser with a fourth strength smaller than the second strength from the upper side of the substrate 100 to form the opening in which the partial area of the second electrode 126 and the compositions thereover are melted and transpired, forming the disconnection area 24. Thereafter, each opening is plugged up and the flattening layer 144 of the organic insulation material is formed to cover the passivation layer 143, forming the scintillator 200 on the flattening layer 144. This provides the apparatus illustrated in FIGS. 2A and 2B. In the present exemplary embodiment, the process illustrated in FIG. 4C corresponds to a third process of the present invention.

A second exemplary embodiment is described below.

Figure 5A:
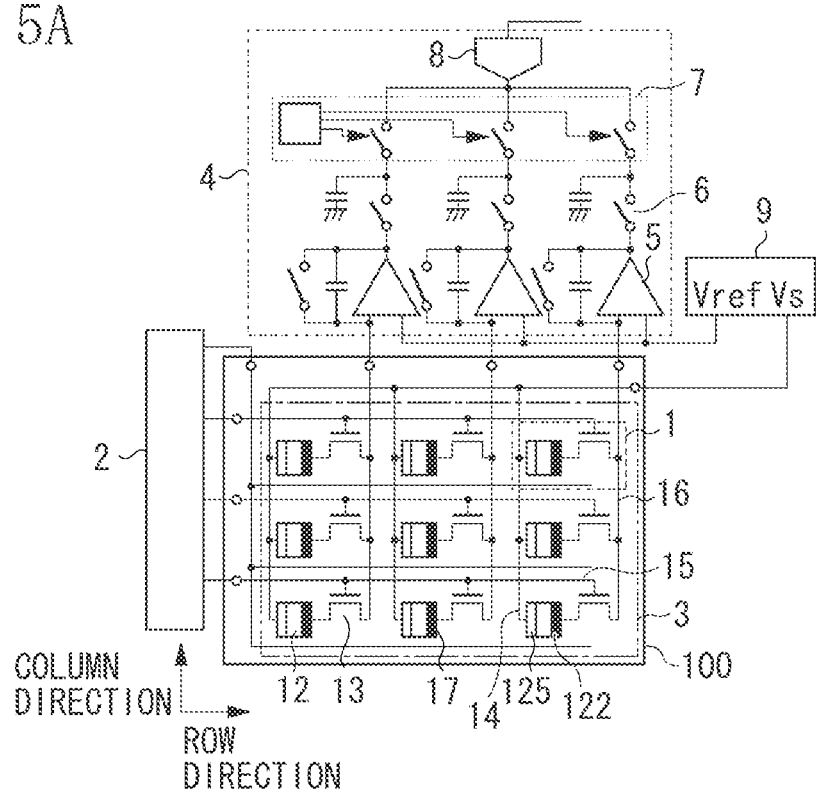
FIG. 5A is a schematic equivalent circuit diagram of a detection apparatus according to a second exemplary embodiment.

A schematic equivalent circuit of a detection apparatus according to the second exemplary embodiment is described below with reference to FIG. 5A. The components similar to those described in the first exemplary embodiment are given the same reference numerals, so that the detailed description thereof is omitted.

In the first exemplary embodiment illustrated in FIG. 1A, the constant potential wire 17 is arranged in parallel to the signal wire 16 and in the column direction. In the second exemplary embodiment illustrated in FIG. 5A, the constant potential wire 17 is arranged in parallel to the signal wire 15 and in the row direction. The configuration other than the above is similar to the one in the first exemplary embodiment, so that the detailed description thereof is omitted.

Figure 5B:
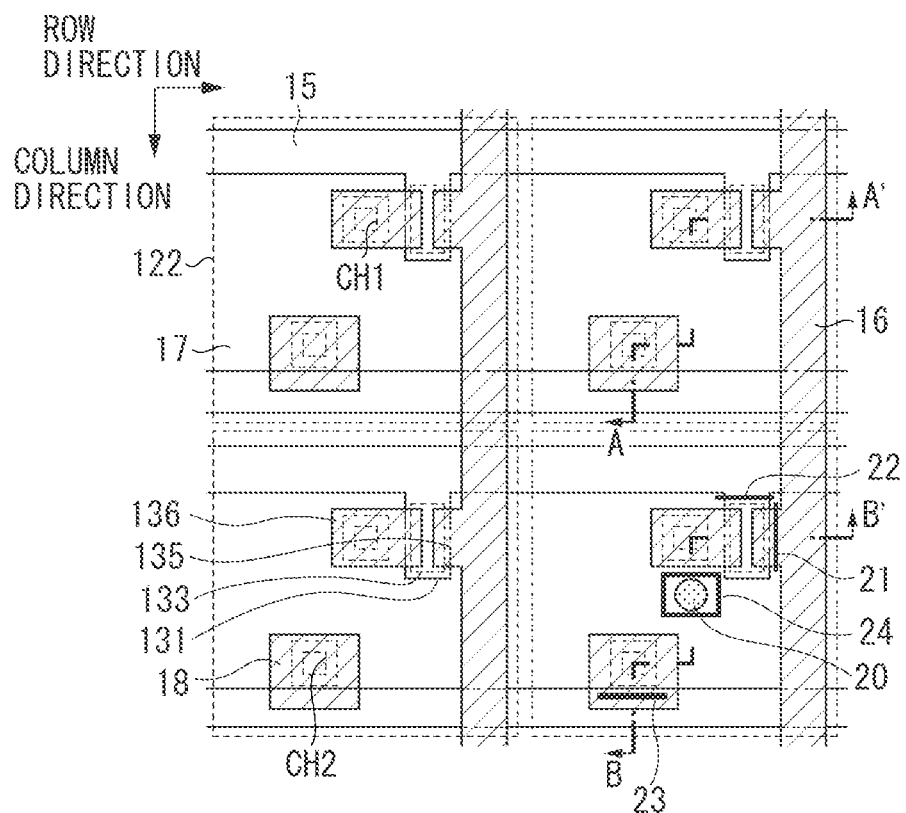
FIG. 5B is a schematic top view of a pixel in the detection apparatus according to the second exemplary embodiment.
Figure 6A:
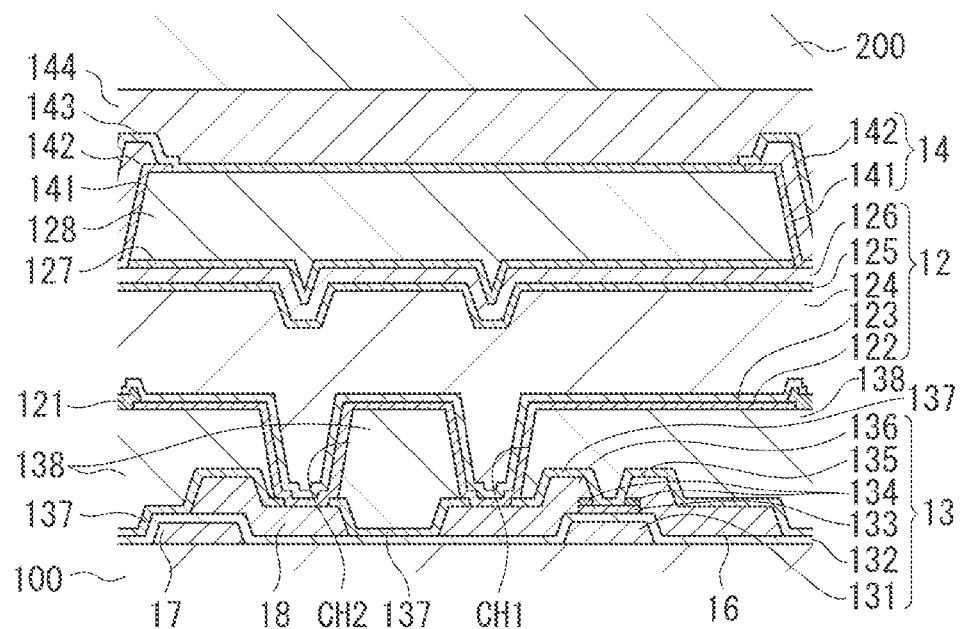
FIGS. 6A and 6B are schematic cross sections of one pixel in the detection apparatus according to the second exemplary embodiment.
Figure 6B:
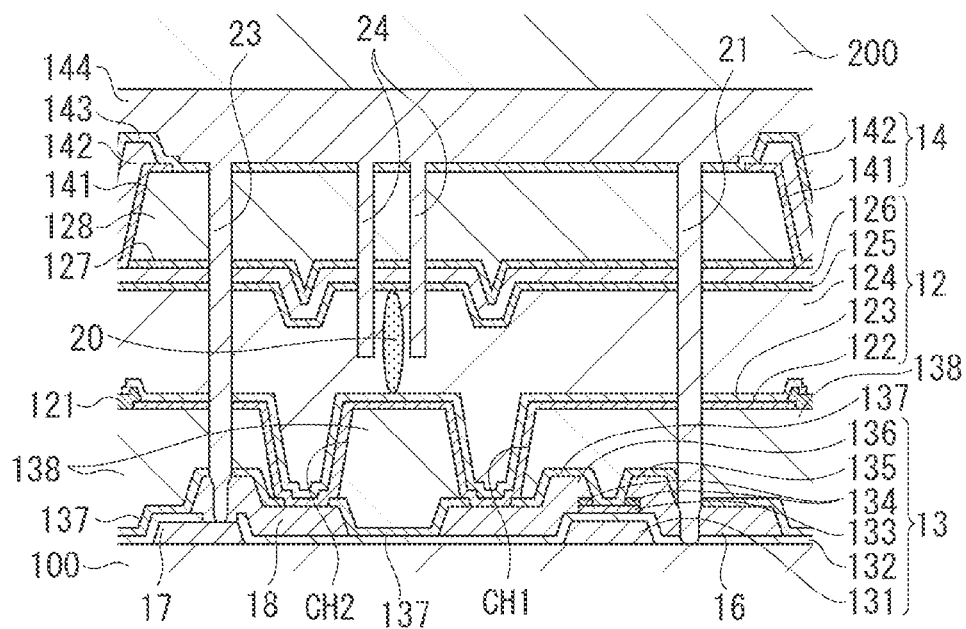

The configuration of the detection apparatus according to the second exemplary embodiment is described below with reference to FIG. 5B and FIGS. 6A and 6B. FIG. 5B is a schematic top view of one pixel and illustrates only a first electrode 122 of the conversion element with each insulation layer and the semiconductor layers of the conversion element omitted for the sake of simplification. FIG. 6A is a schematic cross section along line A-A' of a normal pixel in FIG. 5B. FIG. 6B is a schematic cross section along line B-B' of a defective pixel in FIG. 5B. FIGS. 6A and 6B illustrate also each insulation layer and the semiconductor layers of the conversion element omitted in FIG. 5B. The components similar to those described in the first exemplary embodiment are given the same reference numerals, so that the detailed description thereof is omitted.

In the first exemplary embodiment, the control electrode 131, the control wire 15, and the connection member 18 are formed of the same conductive film, and the first main electrode 135, the second main electrode 136, the signal wire 16, and the constant potential wire 17 are formed of the same conductive film. The constant potential wire 17 is arranged on the connection member 18 so that at least a part of the constant potential wire 17 is superimposed on the connection member 18 via the insulation layer 132. The defective pixel includes the connection area 23 where the area of the constant potential wire 17 superimposed on the connection member 18 is welded to the connection member 18 by laser irradiation.

On the other hand, in the second exemplary embodiment, the control electrode 131, the control wire 15, and the constant potential wire 17 are formed of the same conductive film, and the first main electrode 135, the second main electrode 136, the signal wire 16, and the connection member 18 are formed of the same conductive film. The connection member 18 is arranged on the constant potential wire 17 so that at least a part of the connection member 18 is superimposed on the constant potential wire 17 via the insulation layer 132. The defective pixel includes the connection area 23 where the area of the connection member 18 superimposed on the constant potential wire 17 is welded to the constant potential wire 17 by laser irradiation. The configuration other than the above is similar to the one in the first exemplary embodiment, so that the detailed description thereof is omitted.

A method for manufacturing the detection apparatus according to the second exemplary embodiment is described below with reference to FIGS. 7A to 7C. In the following, only the processes different in the manufacturing method from those of the first exemplary embodiment are described. The detailed description of the processes similar to those described in the first exemplary embodiment is omitted.

Figure 7A:
FIGS. 7A to 7C are schematic cross sections illustrating a method for manufacturing the detection apparatus according to the second exemplary embodiment.

In the process illustrated in FIG. 7A, a conductive film of Al is deposited on the insulative substrate 100 by the sputtering method and wet-etched to form the control wire 15 (not illustrated), the control electrode 131, and the constant potential wire 17.

Figure 7B:
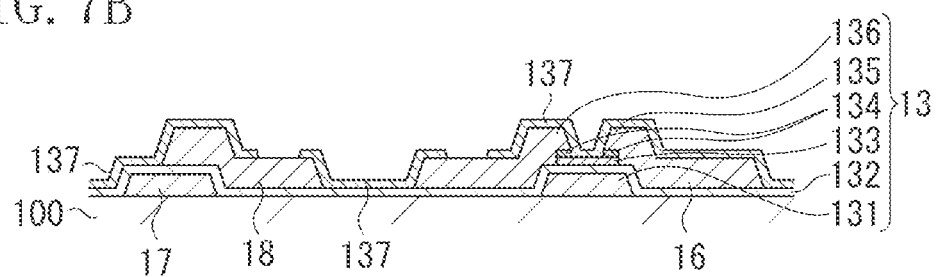

In the process illustrated in FIG. 7B, an insulation film of silicon nitride film is deposited by the plasma CVD method to cover the control wire 15, the control electrode 131, and the constant potential wire 17. A semiconductor film of amorphous silicon film and amorphous silicon film to which phosphorus is doped as an impurity as the first conductivity type impurity semiconductor film are deposited one on top of another by the plasma CVD method to form the semiconductor layer 133 and the impurity semiconductor layer 134 by dry etching. A conductive film of Al is deposited by the sputtering method to cover the impurity semiconductor layer 134 and wet-etched to form the signal wire 16, the first main electrode 135, the second main electrode 136, and the connection member 18.

An insulation film of silicon nitride film is deposited by the plasma CVD method to cover the signal wire 16, the first main electrode 135, the second main electrode 136, and the connection member 18. The insulation film of a partial area on the connection member 18 and a partial area on the second main electrode 136 is removed by the dry etching to form the insulation layer 132 and the protection layer 137. The plurality of TFTs 13, the control wires 15, the signal wires 16, the constant potential wires 17, and the connection members 18 are formed on the substrate 100 in the processes illustrated in FIGS. 7A and 7B. In the present exemplary embodiment, the processes illustrated in FIGS. 7A and 7B correspond to the first process of the present invention.

Figure 7C:
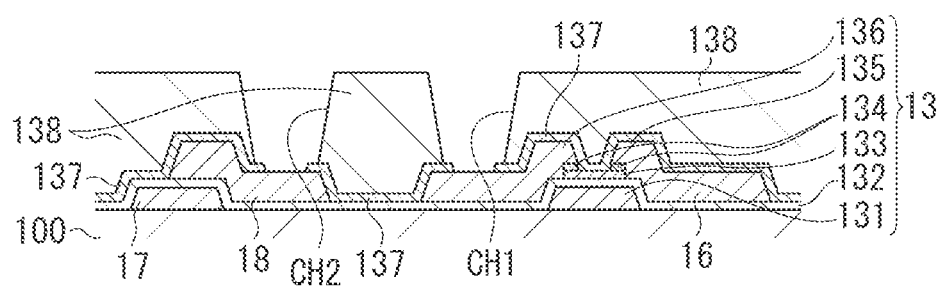

In the process illustrated in FIG. 7C, acrylic resin being a photosensitive organic material is coated to form a film as the interlayer insulating layer using the coating device such as a spinner to cover the TFT 13, the connection member 18, and the protection layer 137. The interlayer insulation film in a partial area on the connection member 18 and a partial area on the second main electrode 136 is removed using the desired mask and by exposure and development processes to form the interlayer insulating layer 138 having the first and second contact holes CH1 and CH2. Since the subsequent processes are similar to those described in the first exemplary embodiment, the detailed description thereof is omitted.

A third exemplary embodiment is described below.

Figure 8:
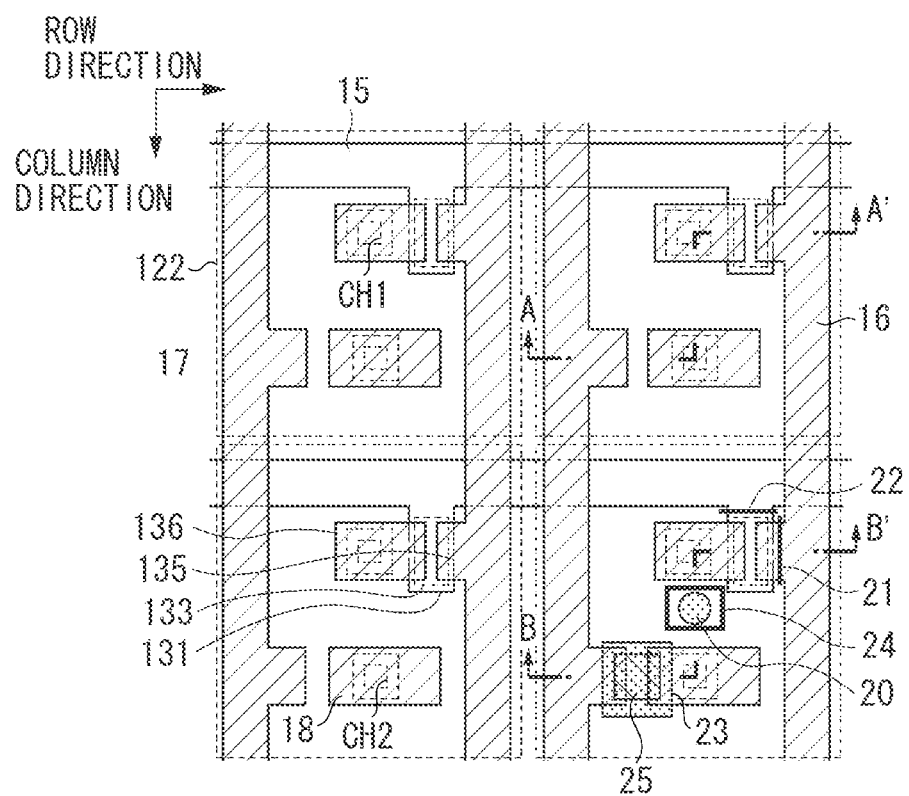
FIG. 8 is a schematic top view of a pixel in a detection apparatus according to a third exemplary embodiment.
Figure 9A:
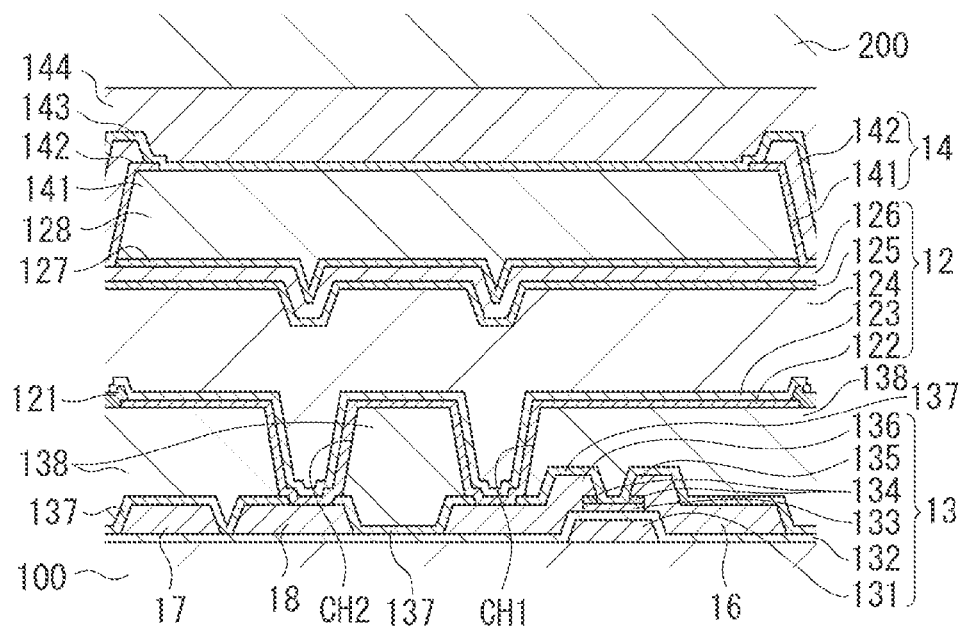
FIGS. 9A and 9B are schematic cross sections of one pixel in the detection apparatus according to the third exemplary embodiment.
Figure 9B:
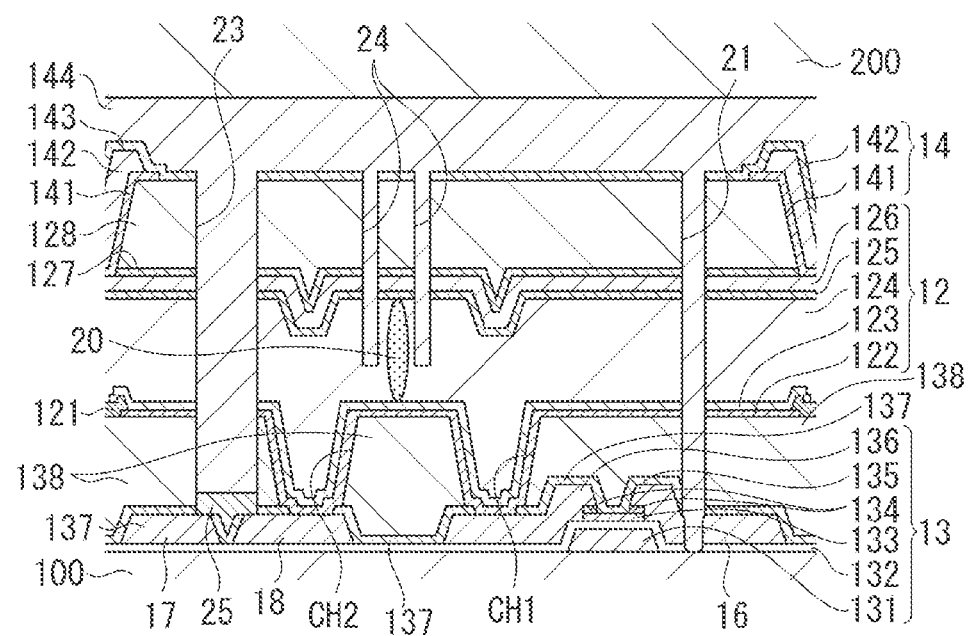

The configuration of the detection apparatus according to the third exemplary embodiment is described below with reference to FIG. 8 and FIGS. 9A and 9B. FIG. 8 is a schematic top view of one pixel and illustrates only a first electrode 122 of the conversion element with each insulation layer and the semiconductor layers of the conversion element omitted for the sake of simplification. FIG. 9A is a schematic cross section along line A-A' of a normal pixel in FIG. 8. FIG. 9B is a schematic cross section along line B-B' of a defective pixel in FIG. 8. FIGS. 9A and 9B illustrate also each insulation layer and the semiconductor layers of the conversion element omitted in FIG. 8. The components similar to those described in the above exemplary embodiments are given the same reference numerals, so that the detailed description thereof is omitted.

In the third exemplary embodiment, the first main electrode 135, the second main electrode 136, the signal wire 16, the constant potential wire 17, and the connection member 18 are formed of the same conductive film. The defective pixel further includes an opening provided so as to expose the connection member 18 and the constant potential wire 17 which underlie the first electrode 122, and the conductive layer 25 which is arranged in the opening and connects the connection member 18 to the constant potential wire 17. In the present exemplary embodiment, the constant potential wire 17 and the connection member 18 are formed of the same conductive film, however, the present invention is not limited to this. Similarly to the first and second exemplary embodiments, the constant potential wire 17 or the connection member 18 may be formed of the same conductive film as that used in the control electrode 131.

A method for manufacturing the detection apparatus according to the third exemplary embodiment is described below with reference to FIGS. 10A to 10D and FIGS. 11A and 11B. FIGS. 10A to 10D are schematic cross sections along A-A' of the normal pixel in FIG. 8 in the manufacturing process. FIGS. 11A and 11B are schematic cross sections along B-B' of the defective pixel in FIG. 8. In the following, only the processes different in the manufacturing method from those of the first exemplary embodiment are described. The detailed description of the processes similar to those described in the first exemplary embodiment is omitted.

Figure 10A:
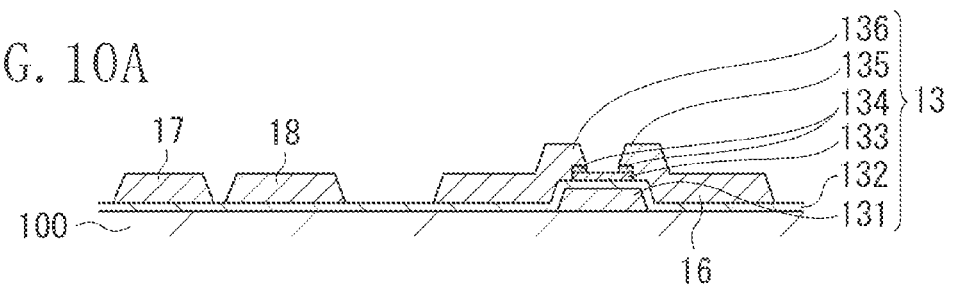
FIGS. 10A to 10D are schematic cross sections illustrating a method for manufacturing the detection apparatus according to the third exemplary embodiment.
Figure 11A:
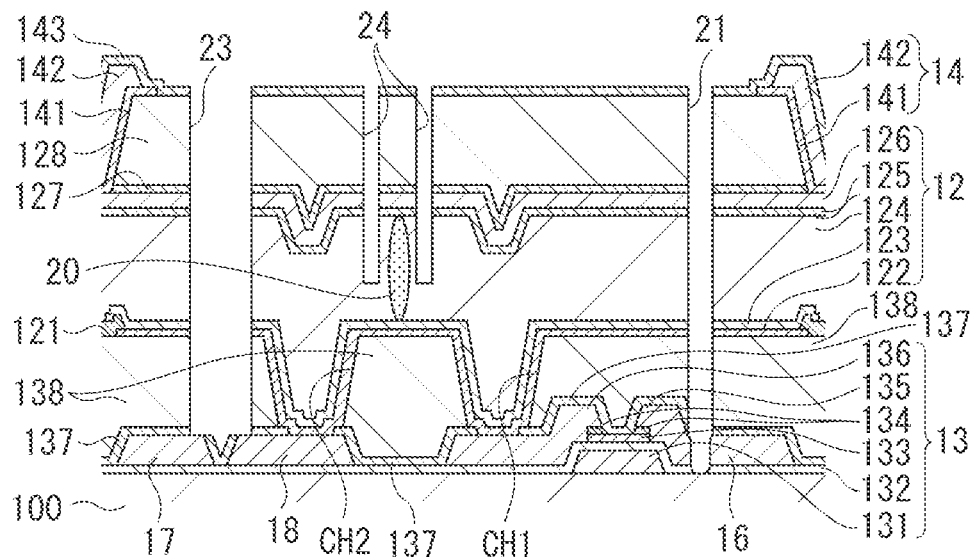
FIGS. 11A and 11B are schematic cross sections illustrating a method for manufacturing the detection apparatus according to the third exemplary embodiment.
Figure 11B:
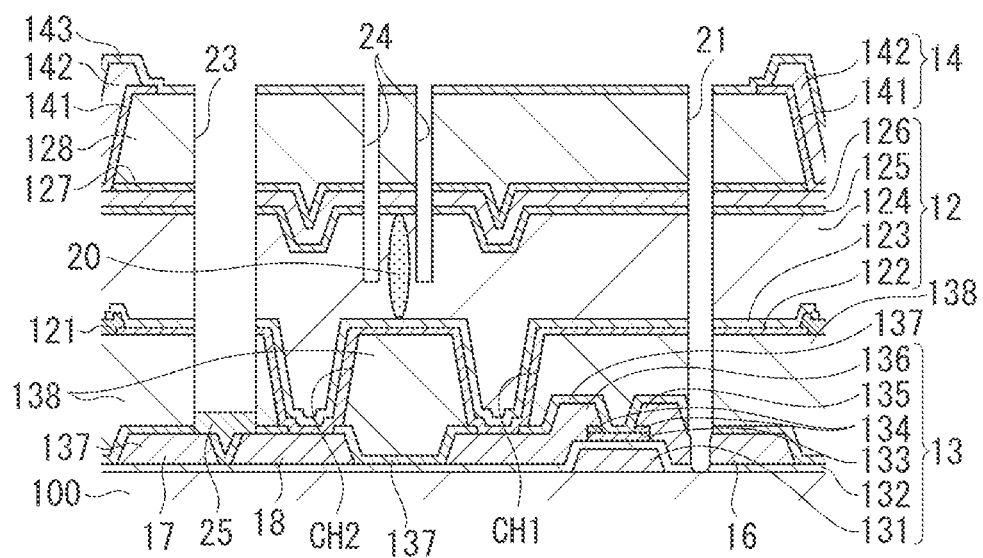

In the process illustrated in FIG. 10A, a conductive film of Al is deposited on the insulative substrate 100 by the sputtering method and wet-etched to form the control wire 15 (not illustrated) and the control electrode 131. An insulation film of silicon nitride film is deposited by the plasma CVD method to cover the control wire 15, the control electrode 131, and the constant potential wire 17, forming the insulation layer 132. A semiconductor film of amorphous silicon film and amorphous silicon film to which phosphorus is doped as an impurity as the first conductive impurity semiconductor film are deposited one on top of another by the plasma CVD method to from the semiconductor layer 133 and the impurity semiconductor layer 134 by dry etching. A conductive film of Al is deposited by the sputtering method to cover the impurity semiconductor layer 134 and wet-etched to form the signal wire 16, the first main electrode 135, the second main electrode 136, the constant potential wire 17, and the connection member 18.

Figure 10B:
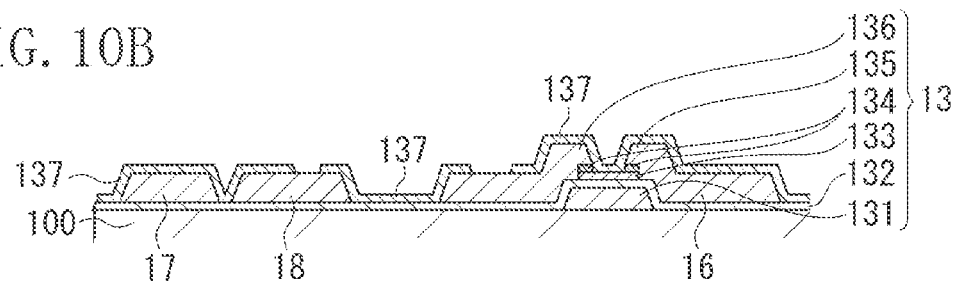

In the process illustrated in FIG. 10B, an insulation film of silicon nitride film is deposited by the plasma CVD method to cover the signal wire 16, the first main electrode 135, the second main electrode 136, the constant potential wire 17, and the connection member 18. The insulation film of a partial area on the connection member 18 and a partial area on the second main electrode 136 is removed by the dry etching to form the protection layer 137. The plurality of TFTs 13, the control wires 15, the signal wires 16, the constant potential wires 17, and the connection members 18 are formed on the substrate 100 in the processes illustrated in FIGS. 10A and 10B. In the present exemplary embodiment, the processes illustrated in FIGS. 10A and 10B correspond to the first process of the present invention.

Figure 10C:
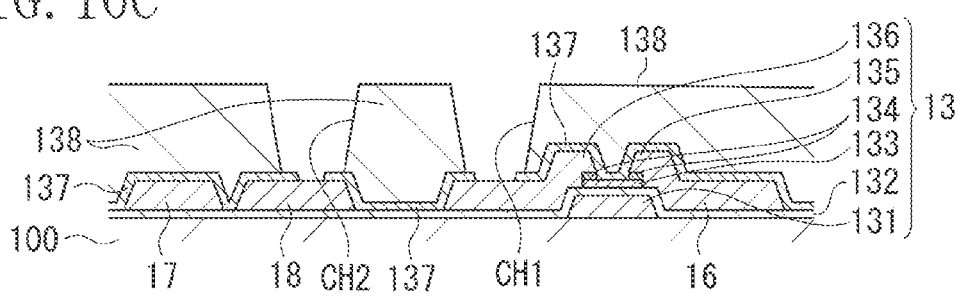

In the process illustrated in FIG. 10C, acrylic resin being a photosensitive organic material is coated to form a film as the interlayer insulating layer using the coating device such as a spinner to cover the TFT 13, the connection member 18, and the protection layer 137. The interlayer insulation film of a partial area on the connection member 18 and a partial area on the second main electrode 136 is removed using the desired mask and by exposure and development processes to form the interlayer insulating layer 138 having the first and second contact holes CH1 and CH2.

Figure 10D:
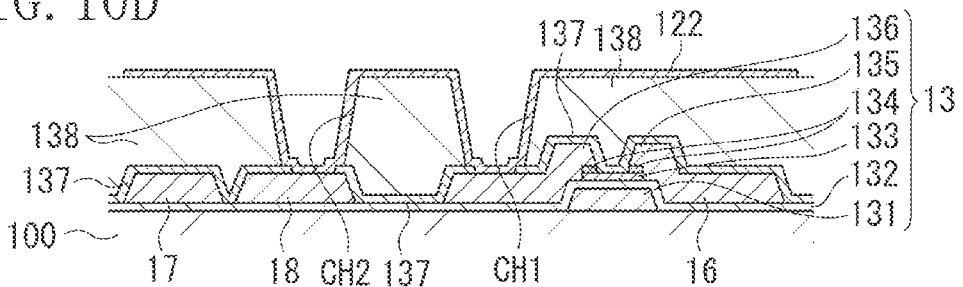

In the process illustrated in FIG. 10D, an amorphous transparent conductive oxide film of the ITO is deposited by the sputtering method to cover the TFT 13, the connection member 18, and the interlayer insulating layer 138. The transparent conductive oxide film is wet-etched using the desired mask and polycrystallized by the anneal process to form the first electrode 122. By the process, the first electrode 122 is electrically connected to the predetermined connection member 18, and is not electrically connected to the constant potential electric wire 17. Since the subsequent processes are similar to those described in the first exemplary embodiment, the detailed description thereof is omitted.

The formation of a disconnection area and a connection area in the defective pixel is described below with reference to FIGS. 11A and 11B. In the following, only the processes different in the manufacturing method from those of the first exemplary embodiment are described. The detailed description of the processes similar to those described in the first exemplary embodiment is omitted.

In the process illustrated in FIG. 11A, the partial area on the connection member 18 and the partial area on the constant potential wire 17 is irradiated with laser with a third strength smaller than the second strength from the upper side of the substrate 100. This transpires the compositions over the partial area on the connection member 18 and the partial area on the constant potential wire 17 to form the opening exposing the connection member 18 and the constant potential wire 17. The methods for forming the disconnection area 21, the disconnection area 22, and the disconnection area 24 are similar to those described in the first exemplary embodiment, so that the detailed description thereof is omitted.

In the process illustrated in FIG. 11B, the conductive layer 25 for electrically connecting the connection member 18 to the constant potential wire 17 is formed in the opening over the partial area on the connection member 18 and the partial area on the constant potential wire 17. In the present exemplary embodiment, a compound semiconductor material is deposited using a metal organic chemical vapor deposition (MOCVD) method to form the conductive layer 25 made of the compound semiconductor material. The present invention is not limited to this, but the conductive layer 25 may be formed using a conductive paste. In the present exemplary embodiment, the processes illustrated in FIGS. 11A and 11B correspond to the third process of the present invention. Since the subsequent processes are similar to those described in the first exemplary embodiment, the detailed description thereof is omitted.

A fourth exemplary embodiment is described below.

Figure 12:
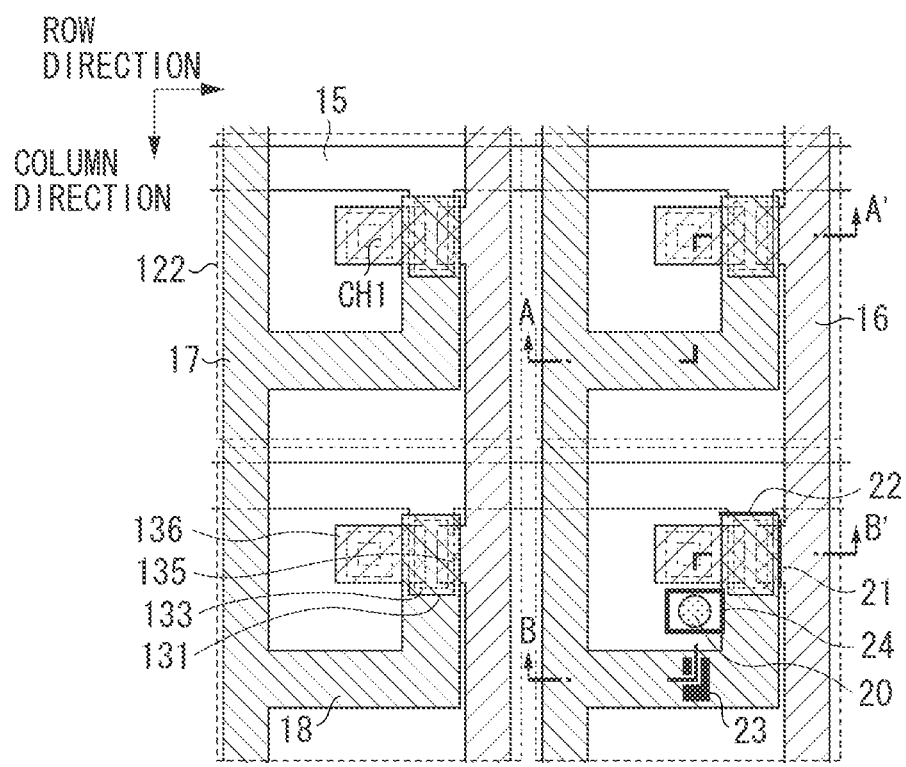
FIG. 12 is a schematic top view of a pixel in a detection apparatus according to a fourth exemplary embodiment.
Figure 13A:
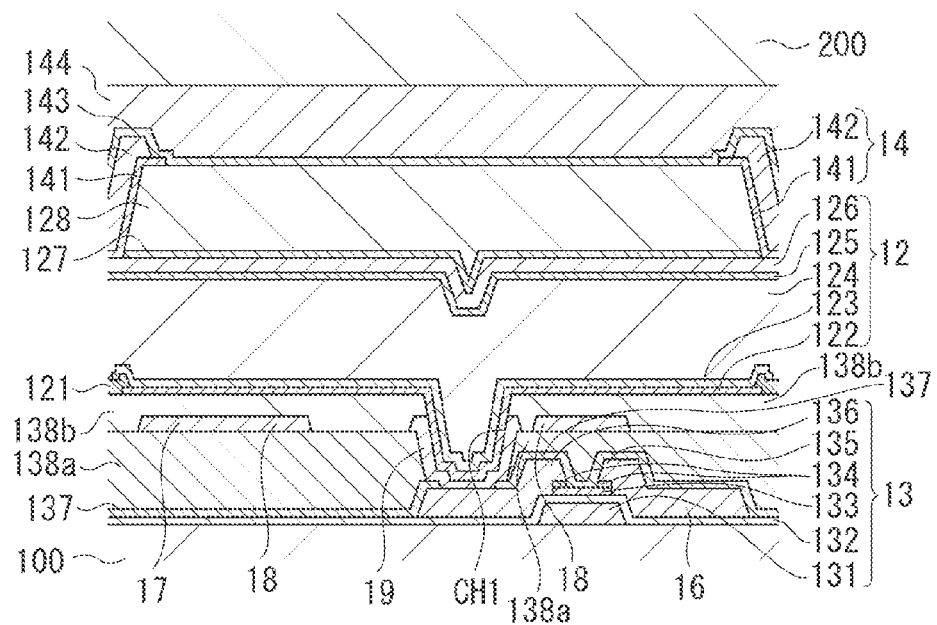
FIGS. 13A and 13B are schematic cross sections of one pixel in the detection apparatus according to the fourth exemplary embodiment.
Figure 13B:
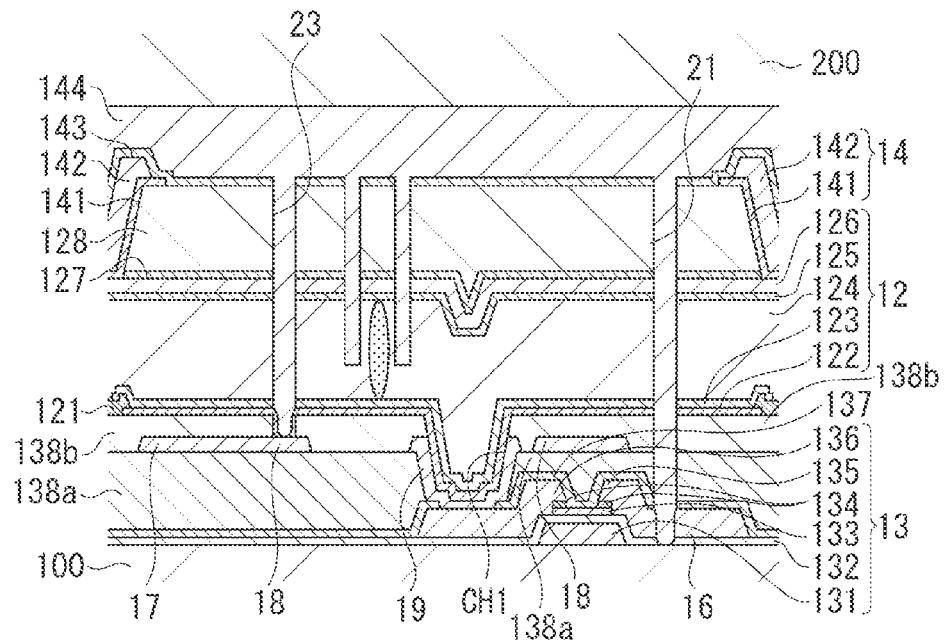

The configuration of the detection apparatus according to the fourth exemplary embodiment is described below with reference to FIG. 12 and FIGS. 13A and 13B. FIG. 12 is a schematic top view of one pixel and illustrates only a first electrode 122 of the conversion element with each insulation layer and the semiconductor layers of the conversion element omitted for the sake of simplification. FIG. 13A is a schematic cross section along line A-A' of a normal pixel in FIG. 12. FIG. 13B is a schematic cross section along line B-B' of a defective pixel in FIG. 12. FIGS. 13A and 13B illustrate also each insulation layer and the semiconductor layers of the conversion element omitted in FIG. 12. The components similar to those described in the above exemplary embodiments are given the same reference numerals, so that the detailed description thereof is omitted.

In the fourth exemplary embodiment, first and second interlayer insulating layers 138a and 138b which are a plurality of interlayer insulating layers are arranged between the substrate 100 and the TFT 13 and the first electrode 122. The connection member 18 is formed as a part of the constant potential wire 17. The constant potential wire 17 and the connection member 18 are arranged between the first and second interlayer insulating layers 138a and 138b. A part of the connection member 18 supplied with a constant potential is arranged between the semiconductor layer 133 of the TFT 13 and the first electrode 122 to function as a shield of the semiconductor layer 133 from the first electrode 122. An intermediate layer 19 which is formed of the same conductive film as the constant potential wire 17 and the connection member 18 and electrically connects the second main electrode 136 to the first electrode 122 is arranged between the second main electrode 136 and the first electrode 122. The intermediate layer 19 allows reducing a connection resistance between the second main electrode 136 and the first electrode 122. The defective pixel includes the connection area 23 where the partial area of the first electrode 122 positioned on the partial area of the connection member 18 is welded to the connection member 18 by laser irradiation. The configuration other than the above is similar to the one in the first exemplary embodiment, so that the detailed description thereof is omitted.

A method for manufacturing the detection apparatus according to the fourth exemplary embodiment is described below with reference to FIGS. 14A to 14D and FIG. 15. In the following, only the processes different in the manufacturing method from those of the first exemplary embodiment are described. The detailed description of the processes similar to those described in the first exemplary embodiment is omitted.

In the process illustrated in FIG. 14, a conductive film of Al is deposited on the insulative substrate 100 by the sputtering method and wet-etched to form the control wire 15 (not illustrated), the control electrode 131. An insulation film of silicon nitride film is deposited by the plasma CVD method to cover the control wire 15, the control electrode 131, and the constant potential wire 17, forming the insulation layer 132. A semiconductor film of amorphous silicon film and amorphous silicon film to which phosphorus is doped as an impurity as the first conductivity type impurity semiconductor film are deposited one on top of another by the plasma CVD method to form the semiconductor layer 133 and the impurity semiconductor layer 134 by dry etching. A conductive film of Al is deposited by the sputtering method to cover the impurity semiconductor layer 134 and wet-etched to form the signal wire 16, the first main electrode 135, and the second main electrode 136.

An insulation film of silicon nitride film is deposited by the plasma CVD method to cover the signal wire 16, the first main electrode 135, and the second main electrode 136. The insulation film of a partial area on the second main electrode 136 is removed by the dry etching to form the protection layer 137. This forms the plurality of TFTs 13, the control wires 15, the signal wires 16 on the substrate 100. Acrylic resin being a photosensitive organic material is coated to form a film as the interlayer insulating layer using the coating device such as a spinner to cover the TFT 13 and the protection layer 136. The interlayer insulation film in a partial area on the second main electrode 136 is removed using the desired mask and by exposure and development processes to form a first interlayer insulating layer 138a having the first contact hole CH1.

Figure 14A:
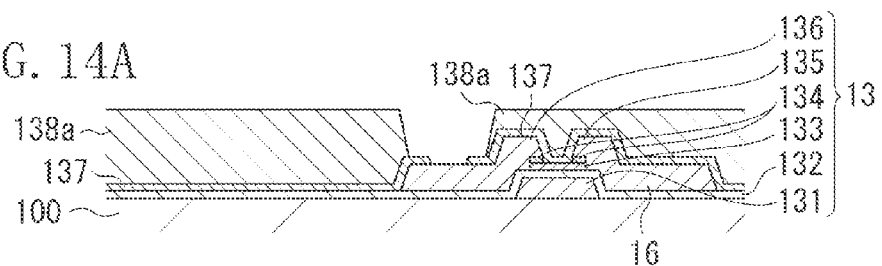
FIGS. 14A to 14D are schematic cross sections illustrating a method for manufacturing the detection apparatus according to the fourth exemplary embodiment.
Figure 14B:
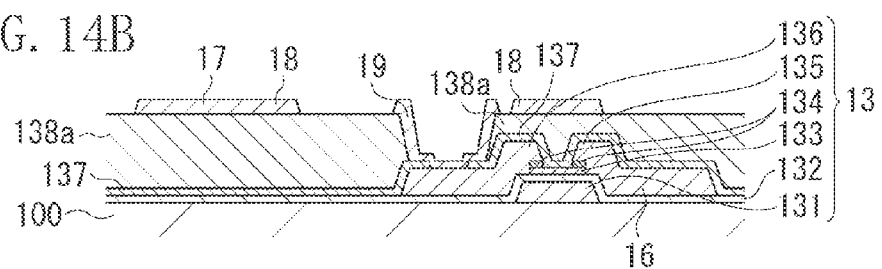

In the process illustrated in FIG. 14B, a conductive film of Al is deposited by the sputtering method to cover the second main electrode 136 and the first interlayer insulating layer 138a and wet-etched to form the constant potential wire 17, the connection member 18, and the intermediate layer 19.

Figure 14C:
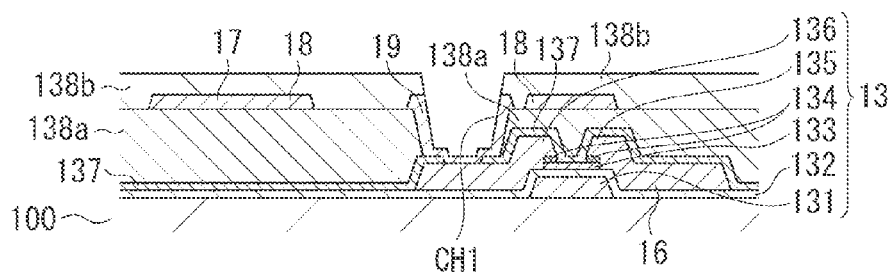

In the process illustrated in FIG. 14C, acrylic resin being a photosensitive organic material is coated to form a film as the interlayer insulating layer using the coating device such as a spinner to cover the first interlayer insulating layer 138a, the constant potential wire 17, the connection member 18, and the intermediate layer 19. The interlayer insulation film in a partial area on the intermediate layer 19 is removed using the desired mask and by exposure and development processes to form the second interlayer insulating layer 138b having the first contact hole CH1. In the present exemplary embodiment, the processes illustrated in FIGS. 14A to 14C correspond to the first process of the present invention.

Figure 14D:
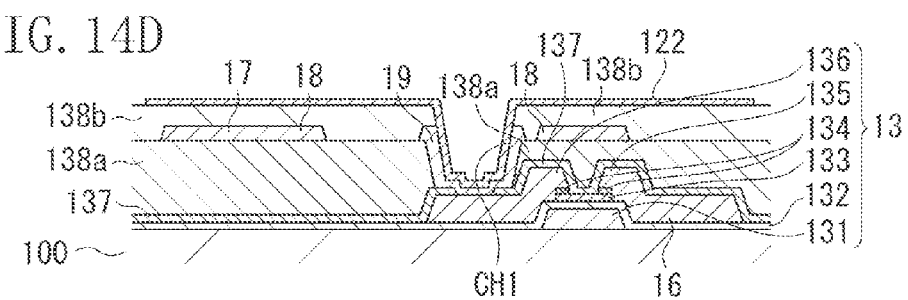

In the process illustrated in FIG. 14D, an amorphous transparent conductive oxide film of the ITO is deposited by the sputtering method to cover the intermediate layer 19 and the second interlayer insulating layer 138b. The transparent conductive oxide film is wet-etched using the desired mask and polycrystallized by an anneal process to form the first electrode 122. This process electrically connects the first electrode 122 to the second main electrode 136 but not to the constant potential wire 17. Since the subsequent processes are similar to those described in the first exemplary embodiment, the detailed description thereof is omitted.

Figure 15:
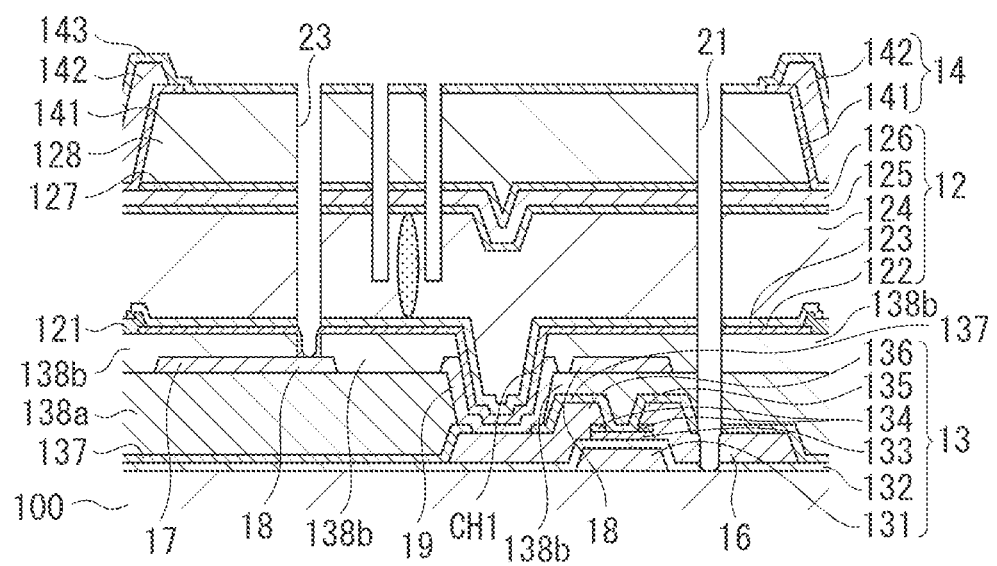
FIG. 15 is a schematic cross section illustrating a method for manufacturing the detection apparatus according to the fourth exemplary embodiment.

The formation of a disconnection area and a connection area in the defective pixel is described below with reference to FIG. 15. In the following, only the processes different in the manufacturing method from those of the first exemplary embodiment are described. The detailed description of the processes similar to those described in the first exemplary embodiment is omitted.

The partial area on the first electrode 122 positioned on the partial area of the connection member 18 is irradiated with laser with the third strength smaller than the second strength from the upper side of the substrate 100. This transpires the second interlayer insulating layer 138b over the connection member 18 to weld the first electrode 122 to the connection member 18, forming the connection area 23, which electrically connects the first electrode 122 to the constant potential wire 17.

A fifth exemplary embodiment is described below.

Figure 16:
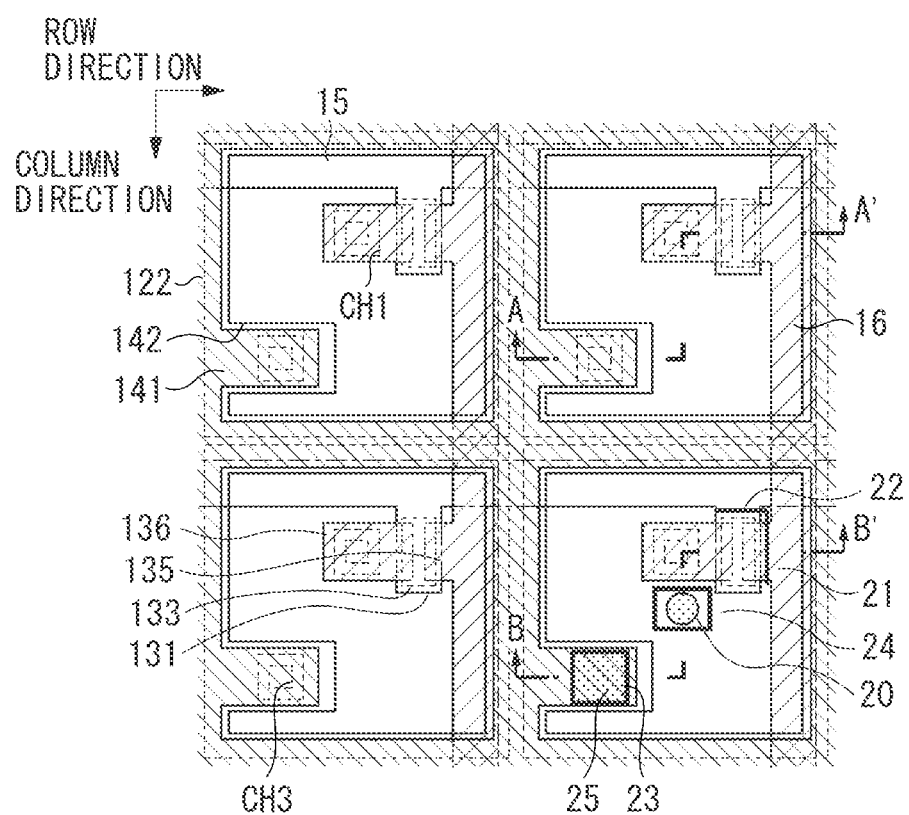
FIG. 16 is a schematic top view of a pixel in a detection apparatus according to a fifth exemplary embodiment.
Figure 17A:
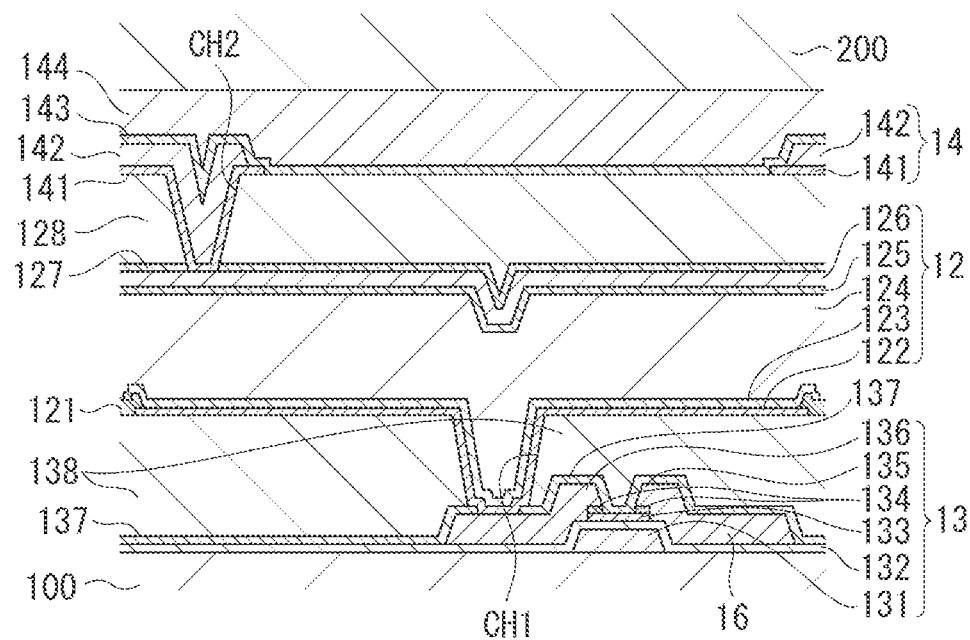
FIGS. 17A and 17B are schematic cross sections of one pixel in the detection apparatus according to the fifth exemplary embodiment.
Figure 17B:
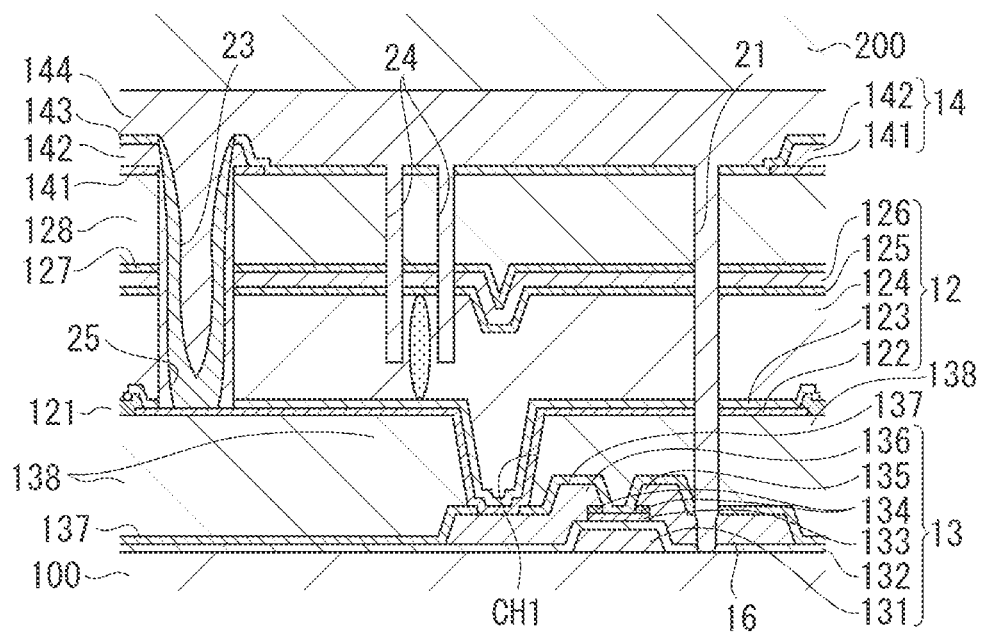

The configuration of the detection apparatus according to the fifth exemplary embodiment is described below with reference to FIG. 16 and FIGS. 17A and 17B. FIG. 16 is a schematic top view of one pixel and illustrates only the first electrode 122, the first conductive layer 141, and the second conductive layer 142 of the conversion element with each insulation layer and the semiconductor layers of the conversion element omitted for the sake of simplification. FIG. 17A is a schematic cross section along line A-A' of a normal pixel in FIG. 16. FIG. 17B is a schematic cross section along line B-B' of a defective pixel in FIG. 16. FIGS. 17A and 17B illustrate also each insulation layer and the semiconductor layers of the conversion element omitted in FIG. 16. The components similar to those described in the above exemplary embodiments are given the same reference numerals, so that the detailed description thereof is omitted.

In the fifth exemplary embodiment, the first and second conductive layers 141 and 142 acting as the electrode wire 14 are used as the constant potential wire 17 and the connection member 18. In the defective pixel, an opening is included in a partial area of the electrode wire 14 including the area connected to the second electrode 126, and the second electrode 126, the second conductive impurity semiconductor layer 125, the semiconductor layer 124, and the first conductive impurity semiconductor layer 123 which are positioned under the area. The opening is formed by laser irradiation similarly to the third exemplary embodiment. The defective pixel further includes the conductive layer 25 for connecting the electrode wire 14 to the first electrode 122. The conductive layer 25 is formed by the method similar to that described in the third exemplary embodiment. In the present exemplary embodiment, the conductive layer 25 is not necessarily essential. The electrode wire 14 may be welded to the first electrode 122 to electrically connect the first electrode 122 to the electrode wire 14. The configuration other than the above is similar to the one in the first exemplary embodiment, so that the detailed description thereof is omitted.

In the present exemplary embodiment, the electrode wire 14 formed of the first and second conductive layers 141 and 142 is provided over the passivation layer 127 and the interlayer insulating layer 128, however, the present invention is not limited to this. The second conductive layer 142 may be directly provided over a part of the second electrode 126 without providing the passivation layer 127 and the interlayer insulating layer 128.

Application Exemplary Embodiment

Figure 18:
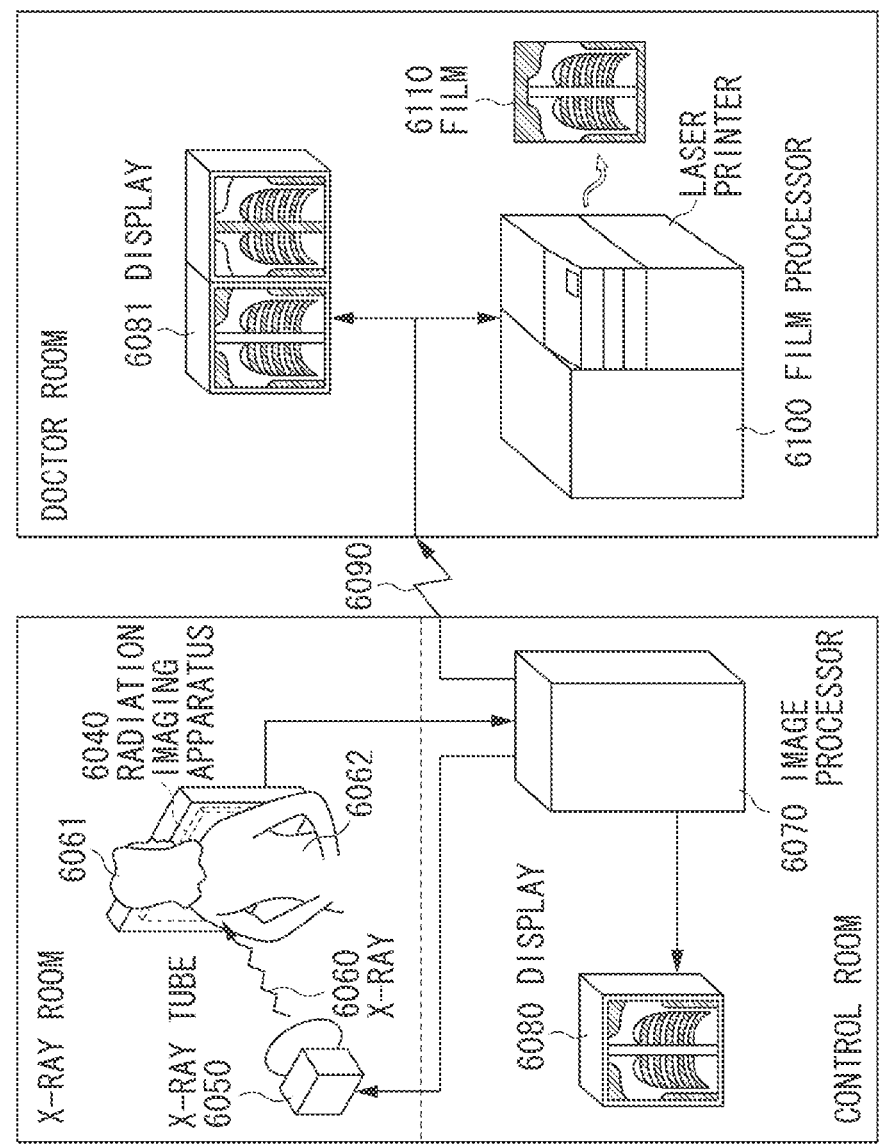
FIG. 18 is a schematic diagram illustrating an application in which the detection apparatus is applied to a detection system.

A radiation detection system using a detection apparatus is described below with reference to FIG. 18.

An X-ray 6060 generated by an X-ray tube 6050 of a radiation source passes through the chest 6062 of a patient or a subject 6061 and is incident on each conversion element 12 of the conversion unit 3 included in a detection apparatus 6040. The incident X-ray includes information about the body of the patient 6061. The conversion unit 3 converts radiation into a charge according to the incidence of the X-ray to output electrical information. The information is converted into digital data, subjected to image processing by an image processor 6070 being an signal processing unit, and can be observed by a display 6080 being a display unit in a control room.

The information can be transferred to a remote area by a transfer processing unit such as a telephone line 6090, displayed on a display 6081 being a display unit in a doctor room in another place or stored in a recording unit such as an optical disk, and diagnosed by a doctor in a remote place. The information can also be recorded in a film 6110 being a recording medium by a film processor 6100 being the recording unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-173961 filed Aug. 6, 2012, which is hereby incorporated by reference herein in its entirety.

What is claimed is:

1. A detection apparatus comprising:
   a plurality of signal wires arranged on a substrate;
   a plurality of pixels arranged on the substrate,
   wherein each of the plurality of pixels includes a switch element arranged on the substrate and a conversion element arranged on the switch element,
   wherein the conversion element includes a first electrode arranged on the switch element and electrically connected to the switch element and a semiconductor layer arranged over a plurality of the first electrodes, and
   wherein a plurality of the switch elements is electrically connected to the plurality of signal wires; and
   a constant potential wire arranged separately from the plurality of signal wires on the substrate and supplied with a constant potential,
   wherein the first electrode is electrically connected to the constant potential wire in a part of pixels among the plurality of pixels.

2. The detection apparatus according to claim 1,
   wherein the connection between the switch elements of the part of pixels and signal wires electrically connected to the switch elements of the part of pixels among the plurality of signal wires is cut off.

3. The detection apparatus according to claim 2, further comprising a plurality of connection members for electrically connecting the first electrode of the conversion elements of the part of pixels to the constant potential wire,
   wherein the plurality of connection members is arranged so that at least a part thereof is superimposed on the constant potential wire via an insulation layer and a predetermined connection member among the plurality of connection members is electrically connected to a predetermined first electrode among a plurality of the first electrodes, and
   wherein the plurality of connection members includes an area where the connection member is welded to the constant potential wire by laser irradiation in a position where the connection member positioned under a first electrode of the conversion element of the part of pixels among the plurality of connection members and the connection member is electrically connected to the constant potential wire via the area.

4. The detection apparatus according to claim 2,
   wherein each of the plurality of the first electrodes is formed on the predetermined connection member among the plurality of connection members and electrically connected to the predetermined connection member,
   wherein the detection apparatus further comprises an opening provided to expose the connection member positioned under the first electrode of the conversion elements of the part of pixels among the plurality of connection members and the constant potential wire, and
   wherein a conductive layer for connecting the connection member to the constant potential wire is arranged in the opening.

5. The detection apparatus according to claim 2, further comprising:

a first interlayer insulating layer arranged on the plurality of signal wires and the plurality of switch elements; and a second interlayer insulating layer arranged on the first interlayer insulating layer, wherein the plurality of connection members connected to the constant potential wire and the constant potential wire are arranged between the first and second interlayer insulating layers, wherein a plurality of the first electrodes is arranged on the second interlayer insulating layer, and wherein in the part of pixels, an area where the second interlayer insulating layer transpired by laser irradiation is provided in an area positioned on the connection member and the connection member is electrically connected to the first electrode via the area.

6. The detection apparatus according to claim 5, wherein the switch element is a thin film transistor including a gate electrode, a source, a drain, and a channel, wherein one of the source and the drain is electrically connected to the first electrode and the other of the source and the drain is connected to the signal wire, and wherein one connection member among the plurality of connection members is formed on the channel of the transistor electrically connected to the first electrode formed on the one connection member.

7. A detection system comprising:

the detection apparatus according to claim 1;

a signal processing unit configured to process a signal output from the detection apparatus;

a display unit configured to display a signal output from the signal processing unit; and a transfer processing unit configured to transfer a signal output from the signal processing unit.

8. The detection apparatus according to claim 1, wherein the constant potential wire is arranged in parallel with the plurality of signal wires.

9. The detection apparatus according to claim 1, further comprising:

a plurality of control wires, wherein the switch element is a thin film transistor including a gate electrode, a source, a drain, and a channel, wherein one of the source and the drain is electrically connected to the first electrode, wherein one of the plurality of signal wires is connected to the other of the source and the drain of a plurality of switch elements in a row of one of the plurality of pixels, wherein one of the plurality of control wires is connected to the gate electrode of the plurality of switch elements in a row of one of the plurality of pixels, and the constant potential wire is arranged in parallel with the plurality of control wires.

10. The detection apparatus according to claim 1, wherein the conversion element further includes a second electrode, wherein the semiconductor layer is arranged between the first electrode and the second electrode, wherein the second electrode is connected to an electrode wire for supplying a bias potential to the second electrode, and wherein the electrode wire is used as the constant potential wire.

* * * * *